US009602317B1

(12) United States Patent
Hailu et al.

(10) Patent No.: US 9,602,317 B1
(45) Date of Patent: Mar. 21, 2017

(54) APPARATUS AND METHOD FOR COMBINING CURRENTS FROM PASSIVE EQUALIZER IN SENSE AMPLIFIER

(71) Applicant: QUALCOMM Incorporated, San Diego, CA (US)

(72) Inventors: Eskinder Hailu, Cary, NC (US); Hanan Cohen, San Diego, CA (US); Bupesh Pandita, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/880,916

(22) Filed: Oct. 12, 2015

(51) Int. Cl.
| | |
|---|---|
| *H04L 25/06* | (2006.01) |
| *H04L 25/10* | (2006.01) |
| *H04L 25/03* | (2006.01) |
| *H04B 1/04* | (2006.01) |

(52) U.S. Cl.
CPC ......... *H04L 25/03885* (2013.01); *H04B 1/04* (2013.01); *H04B 2001/0408* (2013.01)

(58) Field of Classification Search
CPC .... H04B 10/6933; H04B 10/695; H04B 1/30; H04B 1/1036; H04L 25/061; H04L 25/062; H04L 25/063; H04L 25/06; H04L 25/03038; H04L 27/2647; H04L 2025/03414; H04L 25/03057
USPC .................. 375/219–236, 286–294, 316–352
See application file for complete search history.

(56) References Cited

U.S. PATENT DOCUMENTS 3,603,988 A * 9/1971 Johnson ................. H03K 5/082
  342/203
4,270,223 A * 5/1981 Marston ................. H04B 1/123
  327/553
5,047,736 A * 9/1991 Ghose ................ G10K 11/1784
  333/12
5,157,690 A * 10/1992 Buttle ................ H03H 21/0012
  333/18
5,373,388 A * 12/1994 Betts ................... H04B 10/6933
  375/317
5,410,750 A * 4/1995 Cantwell ................. G01S 19/21
  375/148
5,680,420 A * 10/1997 Reime ..................... H04N 5/21
  348/E5.077

(Continued)

OTHER PUBLICATIONS

International Search Report and Written Opinion—PCT/US2016/051359—ISA/EPO—Dec. 2, 2016.

*Primary Examiner* — James M Perez
(74) *Attorney, Agent, or Firm* — Loza & Loza LLP

(57) ABSTRACT

An apparatus configured to apply equalization to an input data signal and detect data based on the equalized data signal. The apparatus includes a passive equalizer comprising a first signal path configured to generate a first signal based on an input signal, and a second signal path configured to generate a second signal by filtering the input signal. The apparatus further includes a sense amplifier having an input circuit configured to generate a third signal related to a combination of the first and second signals, and a data detection circuit configured to generate data based on the third signal. The data detection circuit may be configured as a strong-arm latch. The third signal may be a differential current signal including positive and negative current components. The strong-arm latch generating data based on whether the positive current component is greater than the negative current component.

18 Claims, 12 Drawing Sheets

(56) References Cited

U.S. PATENT DOCUMENTS

| | | | |
|---|---|---|---|
| 5,777,692 A * | 7/1998 | Ghosh | H04L 25/03057 348/21 |
| 5,832,032 A * | 11/1998 | Overbury | H04L 27/2647 370/201 |
| 5,995,567 A * | 11/1999 | Cioffi | H04B 1/123 375/346 |
| 6,011,508 A * | 1/2000 | Perreault | B61L 3/225 246/122 R |
| 6,055,269 A * | 4/2000 | Drost | H04L 25/03878 333/18 |
| 6,169,764 B1 * | 1/2001 | Babanezhad | H04L 25/03885 333/18 |
| 6,266,367 B1 * | 7/2001 | Strait | H03H 21/0012 370/286 |
| 6,317,465 B1 * | 11/2001 | Akamatsu | H04L 25/0272 375/257 |
| 6,459,739 B1 * | 10/2002 | Vitenberg | H04B 3/30 333/12 |
| 6,545,535 B2 * | 4/2003 | Andre | H03F 1/3252 330/149 |
| 6,556,628 B1 * | 4/2003 | Poulton | H04L 25/0266 375/257 |
| 6,567,463 B1 * | 5/2003 | Nicholas | H04L 25/4927 370/252 |
| 6,697,611 B1 * | 2/2004 | Franca-Neto | H03F 3/45982 375/319 |
| 6,937,676 B2 * | 8/2005 | Takada | H04B 1/71 375/346 |
| 6,940,973 B1 * | 9/2005 | Yeap | H04M 3/18 375/285 |
| 6,944,213 B2 * | 9/2005 | Lee | H04B 3/23 370/282 |
| 7,167,027 B2 * | 1/2007 | Matsuo | H03M 9/00 327/212 |
| 7,173,984 B2 * | 2/2007 | Miyoshi | H04B 3/32 375/340 |
| 7,271,623 B2 * | 9/2007 | Palmer | G11C 7/1078 327/52 |
| 7,496,155 B1 * | 2/2009 | Lu | H04L 7/033 327/122 |
| 7,499,489 B1 * | 3/2009 | Ellersick | H04L 25/03057 375/229 |
| 7,511,554 B2 * | 3/2009 | Kaneko | H03K 19/01812 326/63 |
| 7,551,909 B1 * | 6/2009 | Moon | H03L 7/0812 331/19 |
| 7,586,987 B2 * | 9/2009 | Vorenkamp | H04L 25/03878 375/257 |
| 7,599,461 B2 * | 10/2009 | Aziz | H04L 25/03057 375/229 |
| 7,683,720 B1 | 3/2010 | Yehui et al. | |
| 7,822,111 B2 * | 10/2010 | Sohn | H04L 7/0058 375/231 |
| 7,826,551 B2 * | 11/2010 | Lee | H04L 25/0272 327/64 |
| 8,284,848 B2 * | 10/2012 | Nam | H04B 3/00 375/244 |
| 8,391,436 B2 * | 3/2013 | Higeta | H03K 5/1534 375/317 |
| 8,417,752 B1 | 4/2013 | Chan et al. | |
| 8,446,977 B2 * | 5/2013 | Ovchinnikov | H04B 3/50 375/257 |
| 8,472,532 B2 * | 6/2013 | Schley-May | H04B 3/02 375/257 |
| 8,654,830 B1 * | 2/2014 | Lin | H04L 25/03057 375/229 |
| 8,792,597 B2 * | 7/2014 | Malkin | H04B 3/30 370/285 |
| 8,861,663 B1 * | 10/2014 | Sedarat | H04L 25/03012 375/350 |
| 8,861,667 B1 * | 10/2014 | Zerbe | H04L 7/0087 375/229 |
| 8,957,728 B2 * | 2/2015 | Gorisse | H03F 1/34 330/136 |
| 9,118,469 B2 * | 8/2015 | Malkin | H04L 5/16 |
| 9,140,733 B2 * | 9/2015 | Schmidhammer | G01R 27/06 |
| 9,485,085 B2 * | 11/2016 | Arcudia | H03L 7/091 |
| 2003/0012288 A1 * | 1/2003 | Zhou | H04B 3/23 375/260 |
| 2004/0010203 A1 * | 1/2004 | Bibian | A61B 5/048 600/544 |
| 2004/0239374 A1 * | 12/2004 | Hori | H03K 5/003 327/65 |
| 2005/0025266 A1 * | 2/2005 | Chan | H04B 1/586 375/346 |
| 2005/0091620 A1 * | 4/2005 | Aipperspach | G06F 1/04 713/500 |
| 2006/0132191 A1 * | 6/2006 | Palmer | G11C 7/1078 327/52 |
| 2008/0013647 A1 * | 1/2008 | Suzuki | H03D 1/04 375/320 |
| 2008/0198954 A1 * | 8/2008 | Uribe | H04L 25/03038 375/345 |
| 2008/0309395 A1 * | 12/2008 | Kaneko | H03K 19/01812 327/333 |
| 2013/0114665 A1 * | 5/2013 | Aziz | H04L 25/03057 375/233 |
| 2013/0169361 A1 * | 7/2013 | Killat | H03F 3/45183 330/253 |
| 2013/0207718 A1 * | 8/2013 | Lin | H03H 11/1252 327/558 |
| 2013/0258312 A1 * | 10/2013 | Lewis | G01S 17/10 356/4.01 |
| 2014/0146922 A1 * | 5/2014 | Nazemi | H04L 25/0272 375/316 |
| 2014/0177768 A1 * | 6/2014 | van der Goes | H04L 27/0002 375/349 |
| 2015/0207500 A1 * | 7/2015 | Tsunoda | H03K 5/1252 327/551 |
| 2015/0288335 A1 * | 10/2015 | Hoyerby | H03F 3/217 330/251 |
| 2015/0288392 A1 * | 10/2015 | Floyd | H04W 16/14 375/130 |
| 2016/0269172 A1 * | 9/2016 | Arcudia | H03L 7/091 |

* cited by examiner

US 9,602,317 B1

APPARATUS AND METHOD FOR COMBINING CURRENTS FROM PASSIVE EQUALIZER IN SENSE AMPLIFIER

BACKGROUND

Field

Aspects of the present disclosure relate generally to equalizers, and more particularly, to an apparatus and method for combining currents from a passive equalizer in a sense amplifier.

Background

A transmitting device transmits a data signal to a receiving device by way of a transmission medium or channel. The transmission medium or channel may be of many different types, such as one or more conductive traces disposed on a printed circuit board (PCB) or substrate, or a communications cable, such as a coaxial cable.

Generally, the transmission medium or channel has a frequency response that is substantially flat with minimal attenuation from low frequency (e.g., DC) up to a certain high frequency ("cutoff frequency"). Above the cutoff frequency, the transmission medium or channel has a frequency response that attenuates a signal substantially monotonically with increasing frequency.

The rate at which data may be sent from a transmitting device to a receiving device via a transmission medium or channel is directly related to the cutoff frequency response of the transmission medium or channel. That is, higher cutoff frequency translates to higher dates; lower cutoff frequency translates to lower data rates.

Often, a receiving device employs an equalizer to effectively increase the cutoff frequency of the transmission medium or channel so as to allow for the transmission of higher data rates. Typically, the equalizer may be configured to have a gain-frequency response that provides a certain gain for frequencies below the cutoff frequency, and a higher gain profile (e.g., a peak) for frequencies above the cutoff frequency. Accordingly, the combined frequency response of the transmission medium or channel and the equalizer is such that the effective cutoff frequency is higher in frequency than the inherent cutoff frequency of the transmission medium or channel.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first signal path configured to generate a first signal based on an input signal, and a second signal path configured to generate a second signal by filtering the input signal; and a sense amplifier including an input circuit configured to generate a third signal related to a combination of the first and second signals; and a data detection circuit configured to generate data based on the third signal.

Another aspect of the disclosure relates to a method including generating a first signal based on an input signal; filtering the input signal to generate a second signal; generating a third signal related to a combination of the first and second signals; and generating data based on the third signal.

Another aspect of the disclosure relates to an apparatus including means for generating a first signal based on an input signal; means for filtering the input signal to generate a second signal; means for generating a third signal related to a combination of the first and second signals; and means for generating data based on the third signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

BRIEF DESCRIPTION OF THE DRAWINGS

FIG. 14B-1 illustrates a flow diagram of another exemplary method of substantially calibrating out current offset in a sense amplifier in accordance with another aspect of the disclosure.

FIG. 14B-2 illustrates a flow diagram of yet another exemplary method of substantially calibrating out current offset in a sense amplifier in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
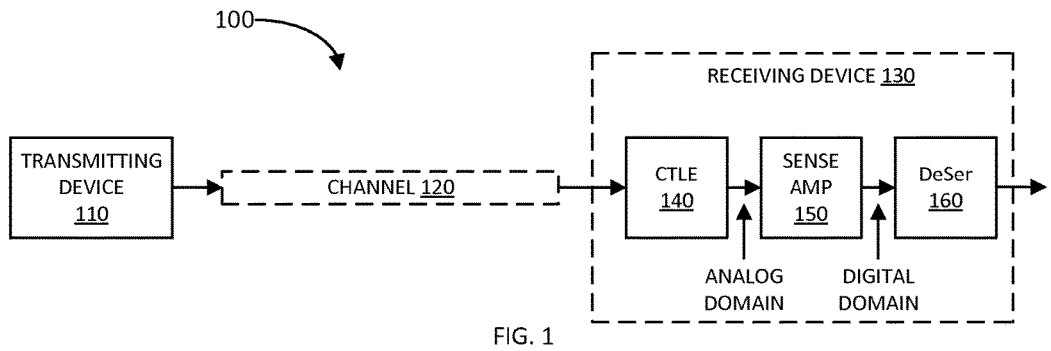
FIG. 1 illustrates a block diagram of an exemplary communication system in accordance with an aspect of the disclosure.

FIG. 1 illustrates a block diagram of an exemplary communication system 100 in accordance with an aspect of the disclosure. The communication system 100 includes a transmitting device 110, a channel 120, and a receiving device 130. The receiving device 130, in turn, includes a continuous time linear equalizer (CTLE) 140, a sense amplifier 150, and a deserializer 160.

In this example, the transmitting device 110 is configured to transmit a serial data signal (e.g., binary phase shift keying (BPSK) modulated data signal or other type of modulated data signal) to the receiving device 130 by way of the channel 120. Although the transmitting device 110 is characterized for its data signal transmission capability, it shall be understood that the transmitting device 110 may be capable of receiving and processing one or more data signals.

The channel 120 may be any type of transmission medium through which a data signal may be sent. For example, the channel 120 may be configured as one or more electrically conductive (e.g., metallization) traces formed on a printed circuit board (PCB) or other type of substrate, cable-type transmission mediums, such as a coaxial cable, or other types of transmission mediums.

As discussed, the receiving device 130 is configured to receive the serial data signal from the transmitting device 110 by way of the channel 120. The receiving device 130 is further configured to process the data signal to generate parallel data for further processing or use by other devices. In this regard, the receiving device 130 includes the CTLE 140, sense amplifier 150, and deserializer 160.

As previously discussed, the channel 120 has a frequency response that passes (without significant attenuation) lower frequency components of the serial data signal and attenuates higher frequency components of the serial data signal. Also, as discussed, such attenuation of high frequencies limits the rate at which data may be transmitted via the channel 120.

To compensate for the high frequency attenuation of the channel 120, and thereby, increase the data rate, the CTLE 140 of the receiving device 130 boosts the high frequency components of the received data signal. Thus, the combined frequency response of the channel 120 and the CTLE 140 is flatter over a wider frequency range than the frequency response of only the channel 120.

The sense amplifier 150 converts the equalized serial data signal at the output of the CTLE 140 from analog domain to digital domain. The deserializer 160 converts the serial digital data at the output of the sense amplifier 150 from serial to parallel.

A drawback of the communication system 100 relates to the use of the CTLE 140 at the receiving device 130. The CTLE 140 is an active equalizer; and thus, consumes power, generates thermal noise, and has an inherent parasitic pole that limits the bandwidth of the equalizer. The limited bandwidth of the CTLE 140 may be improved by increasing the supply voltage applied to it, but this undesirably produces additional power consumption.

Figure 2:
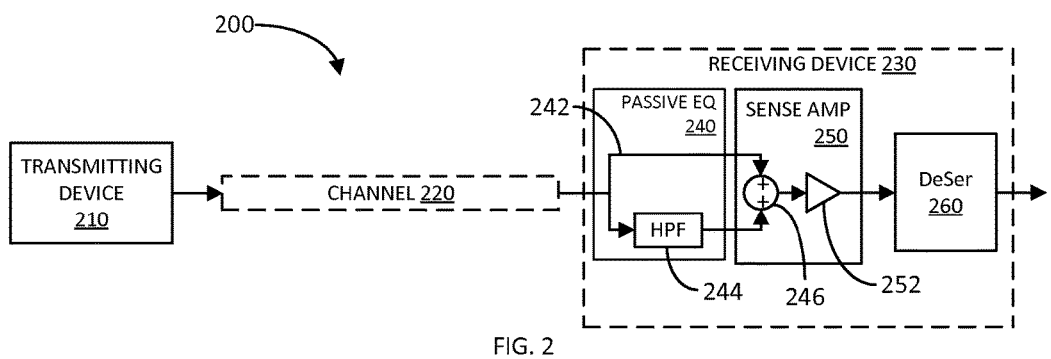
FIG. 2 illustrates a block diagram of another exemplary communication system in accordance with another aspect of the disclosure.

FIG. 2 illustrates a block diagram of another exemplary communication system 200 in accordance with another aspect of the disclosure. Similarly, the communication system 200 includes a transmitting device 210, a channel 220, and a receiving device 230. However, instead of the receiving device 230 including an active equalizer, such as the CTLE 140 of receiving device 130, the receiving device 230 includes a passive equalizer 240.

As shown, the passive equalizer 240 includes a high-pass filter (HPF) 244 and an all-pass path 242. The HPF 244 and the all-pass path 242 receive the serial data signal from the channel 220. The sense amplifier 250 includes an input circuit 246 that combines (e.g., sums) the data signal at the output of the HPF 244 with the data signal at the output of the all-pass path 242. Accordingly, the input circuit 246 of the sense amplifier 250 generates the received data signal with its higher frequency components being boosted. That is, the gain-frequency response of the passive equalizer 240 provides higher gain to higher frequency components of the received data signal in comparison to lower gain to lower frequency components of the received data signal. This is done to compensate the received data signal for high frequency attenuation caused by the channel 220.

The use of the passive equalizer 240 provides benefits over an active equalizer, such as the CTLE 140 of the receiving device 130. For instance, the passive equalizer 240 does not consume power or consumes substantially less power than the CTLE 140; and thus, lower power consumption for the receiving device 230 may be achieved. Additionally, the passive equalizer 240 does not generate thermal noise as does the CTLE 140; and, translates to less noise generated in the receiving device 230. Further, the passive equalizer 240 is easily adaptable to high data rate applications by configuring the components (e.g., capacitor, resistor, inductor, etc.). Also, the passive equalizer 240 may be configured to consume less IC area than the CTLE 140. Moreover, the use of the passive equalizer 240 allows for a lower power supply voltage for the sense amplifier 250; thereby, facilitating less power consumption in the sense amplifier 250.

Referring back to the receiving device 230, the sense amplifier 250 further includes a data detection circuit 252 configured to determine the data from the output of the input circuit 246. As discussed further herein, the data detection circuit 252 may be configured as at least a strong-arm latch. The detected serial data at the output of the data detection circuit 252 is provided to a deserializer 260, which converts the detected serial data into parallel data for further processing or use by other one or more devices.

Figure 3:
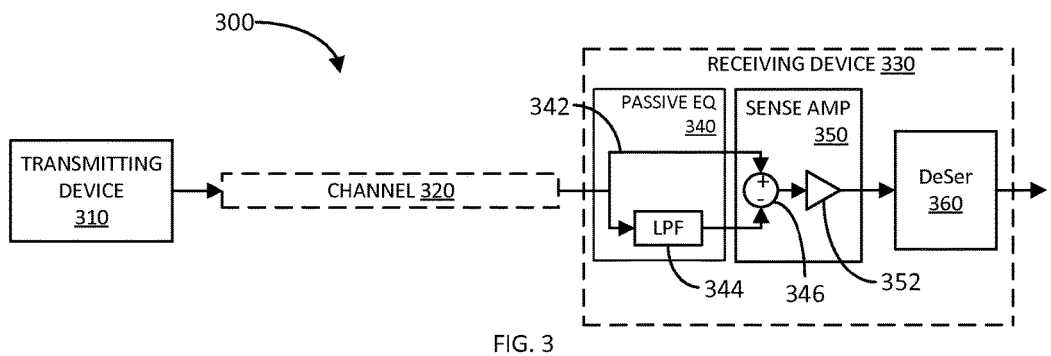
FIG. 3 illustrates a block diagram of another exemplary communication system in accordance with another aspect of the disclosure.

FIG. 3 illustrates a block diagram of another exemplary communication system 300 in accordance with another aspect of the disclosure. The communication system 300 is similar to that of communication system 200, but instead of the receiving device employing an HPF-based passive equalizer, the receiver employs a low-pass filter (LPF)-based passive equalizer.

In particular, the communication system 300 includes a transmitting device 310, a channel 320, and a receiving device 330. The receiving device 330, in turn, includes a passive equalizer 340, a sense amplifier 350, and a deserializer 360. The passive equalizer 340, in turn, includes a low-pass filter (LPF) 344 and an all-pass path 342. The LPF 344 and the all-pass path 342 receive the serial data signal from the channel 320. The sense amplifier 350 includes an input circuit 346 that combines (e.g., subtracts) the data signal at the output of the LPF 344 with the data signal at the output of the all-pass path 342.

Accordingly, the input circuit 346 of the sense amplifier 350 generates the received data signal with its higher frequency components being boosted. That is, the gain-frequency response of the passive equalizer 340 provides higher gain to higher frequency components of the received data signal in comparison to lower gain to lower frequency components of the received data signal. Again, this is done to compensate the received data signal for high frequency attenuation caused by the channel 320.

The sense amplifier 350 further includes a data detection circuit 352 configured to determine the data from the output of the input circuit 346. As discussed further herein, the data detection circuit 352 may be configured as at least a strong-arm latch. The detected serial data at the output of the data detection circuit 352 is provided to a deserializer 360, which converts the detected serial data into parallel data for further processing or use by other one or more devices.

Figure 4:
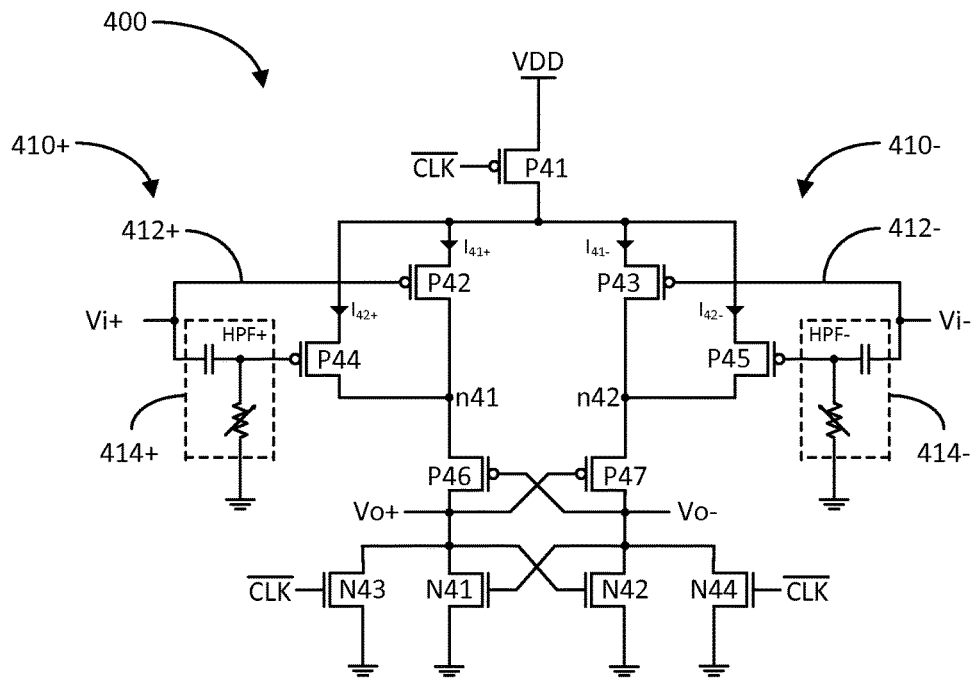
FIG. 4 illustrates a schematic diagram of an exemplary receiving device in accordance with another aspect of the disclosure.

FIG. 4 illustrates a schematic diagram of an exemplary receiving device 400 in accordance with another aspect of the disclosure. In summary, the receiving device 400 includes an HPF-based passive equalizer; and a sense amplifier including an input circuit configured to generate summed currents based on output voltages from the HPF-based passive equalizer, and a strong-arm latch for detecting data of the input signal based on the summed currents. It shall be understood that the receiving device 400 may include other components, such as an additional latch and a deserializer previously discussed.

In this example, the receiving device 400 receives a differential serial data signal Vi+ and Vi−. The receiving device 400 includes a passive equalizer including a positive equalizer component 410+ and a negative equalizer component 410−. The positive equalizer component 410+ is configured to process the positive component Vi+ of the input differential data signal and the negative equalizer component 410− is configured to process the negative component Vi− of the input differential data signal.

More specifically, the positive equalizer component 410+ includes an all-pass path 412+ and an HPF 414+, both of which are configured to receive the positive component Vi+ of the input differential data signal. Similarly, the negative equalizer component 410− includes an all-pass path 412− and an HPF 414−, both of which are configured to receive the negative component Vi− of the input differential data signal. The HPF 414+/414− may be made variable or programmable, as represented by the capacitor and variable resistor, to set its frequency response as desired.

The receiving device 410 further includes a sense amplifier including a positive component of an input circuit, and a negative component of the input circuit. The positive component of the input circuit includes transistors P42 and P44, both of which may be configured as p-channel metal oxide semiconductor (PMOS) field effect transistors (FETs) (referred to herein as "PMOS"). PMOS P42 and P44 include sources coupled together, drains coupled together, and gates configured to respectively receive the output voltages from the all-pass path 412+ and HPF 414+ (e.g., the positive component Vi+ of the input signal and the high-pass filtered positive component of the input signal, respectively).

Similarly, the negative component of the input circuit includes transistors P43 and P45, both of which may be configured as PMOS. PMOS P43 and P45 include sources coupled together, drains coupled together, and gates configured to respectively receive the output voltages of the all-pass path 412− and HPF 414− (e.g., the negative component Vi− of the input signal and the high-pass filtered negative component of the input signal, respectively).

PMOS P42 is configured to generate a current $I_{41+}$ based on the output voltage of the all-pass path 412+ (e.g., based on the positive component Vi+ of the input signal). PMOS P44 is configured to generate a current $I_{42+}$ based on the output voltage of the HPF 414+ (e.g., based on the high-pass filtered positive component of the input signal). PMOS P43 is configured to generate a current $I_{41-}$ based on the output voltage of the all-pass path 412− (e.g., based on the negative component Vi− of the input signal). PMOS P45 is configured to generate a current $I_{42-}$ based on the output voltage of the HPF 414− (e.g., based on the high-pass filtered negative component of the input signal).

The currents $I_{41+}$ and $I_{42+}$ are summed at a positive input node n41 of a strong-arm latch, and the currents $I_{41-}$ and $I_{42-}$ are summed at a negative input node n42 of the strong-arm latch. In essence, the differential signal generated at the positive and negative input nodes n41 and n42 of the strong-arm latch is the input data signal having undergone the equalization performed by the positive and negative components 410+ and 410− of the passive equalizer. In other words, the differential signal, including the summed currents $I_{41+}$ and $I_{42+}$ at the positive input node n41, and the summed currents $I_{41-}$ and $I_{42-}$ at the negative input node n42, may provide a boosted gain for higher frequency components of the input signal as compared to a gain for lower frequency components of the input signal.

The strong-arm latch includes cross-coupled inverters having transistors P46-N41 and P47-N42, respectively. Transistors P46 and P47 are each PMOS, and transistors N41 and N42 are each as n-channel metal oxide semiconductor (NMOS) FET (referred to herein as "NMOS"). The inverters are cross-coupled because the output of inverter P46-N41 (at the drains of these devices) is coupled to the input of inverter P47-N42 (at the gates of these devices), and the output of inverter P47-N42 (at the drains of these devices) is coupled to the input of inverter P46-N41 (at the gates of these devices). The sources of PMOS P46 and P47 are coupled to nodes n41 and n42, respectively. The sources of NMOS N41 and N42 are coupled to ground. The strong-arm latch is configured to generate an output differential data signal with positive and negative components Vo+ and Vo− at the outputs of the inverters P46-N41 and P47-N42, respectively.

The receiving device 400 further includes circuitry for selectively enabling the operation of the input circuit (PMOS P42-P45) and the strong-arm latch (PMOS P46 and P47, and NMOS N41 and N42) based on a clock signal $\overline{CLK}$. The enabling/disabling circuitry includes PMOS P41, NMOS N43, and NMOS N44. PMOS P41 includes a source coupled to a positive voltage rail VDD, a gate configured to receive the clock signal $\overline{CLK}$, and a drain coupled to the sources of PMOS P42-P45. The NMOS N43 and N44 include drains coupled to the respective drains of NMOS N41 and N42, gates configured to receive the clock signal CLK, and sources coupled to ground.

In operation, the positive and negative components Vi+ and Vi− of the input differential data signal are applied to the inputs of the positive and negative components 410+ and 410− of the passive equalizer, respectively. When the sense amplifier is not sampling the input signal, the clock signal $\overline{CLK}$ is in a deasserted state (e.g., a high logic voltage (e.g., ~VDD)). The clock signal $\overline{CLK}$ being in the deasserted state causes PMOS P41 to be off, and NMOS N43 and N44 to be on. The PMOS P41 being off prevents the formation of the currents $I_{41+}$, $I_{41−}$, $I_{42+}$, and $I_{42−}$ by the PMOS P42, P43, P44, and P45, respectively. The NMOS N43 and N44 being on produce substantially ground potential at the drains of the NMOS N41 and N42.

For the sense amplifier to sample the input signal, the clock signal $\overline{CLK}$ is brought to its asserted state (e.g., a low logic voltage (e.g., ground)). The clock signal $\overline{CLK}$ being at a low logic voltage causes PMOS P41 to turn on, and apply VDD to the sources of PMOS P42, P43, P44, and P45. Also, the clock signal $\overline{CLK}$ being at a low logic voltage causes NMOS N43 and N44 to turn off, and allow the drains of the latch NMOS N41 and N42 to be charged. Also, as the gates of PMOS P46 and P47 were previously at ground potential, and now positive voltages are applied to the sources of PMOS P46 and P47 via PMOS P42/P44 and P43/P45, respectively, the PMOS P46 and P47 turn on.

Accordingly, PMOS P42 generates a current $I_{41+}$ based on the positive component Vi+ of the input signal. PMOS P44 generates a current $I_{42+}$ based on the high-pass filtered positive component of the input signal. PMOS P43 generates a current $I_{41−}$ based on the negative component Vi− of the input signal. And, PMOS P44 generates a current $I_{42−}$ based on the high-pass filtered negative component of the input signal. As previously discussed, the currents $I_{41+}$ and $I_{42+}$ are summed at node n41, and the currents $I_{41−}$ and $I_{42−}$ are summed at node n42. The summed currents $I_{41+}$ and $I_{42+}$ charge the drain of NMOS N41, and the summed currents $I_{41−}$ and $I_{42−}$ charge of drain of NMOS N42.

Due to a positive feedback configuration of the cross-coupled inverters P46-N41 and P47-N42, the drain of NMOS N41 or N42 that charges faster due to a higher corresponding current $(I_{41+}+I_{42+})$ or $(I_{41−}+I_{42−})$ causes the strong-arm latch to generate a high logic voltage at such drain and a low logic voltage at the other drain. In other words, the positive and negative components Vo+ and Vo− of the output signal may be given by the following relationship:

Vo+ is high and Vo− is low if $(I_{41+}+I_{42+})>(I_{41−}+I_{42−})$; or

Vo+ is low and Vo− is high if $(I_{41+}+I_{42+})>(I_{41−}+I_{42−})$;

Once the strong-arm latch has detected or generated the data, another latch (not shown in FIG. 4) may be operated to read the data from the positive and negative outputs of the strong-arm latch. The clock signal CLK is thereafter brought to its deasserted state to turn off PMOS P41 and turn on NMOS N43 and N44 to disable the sampling or slicing operation of the sense amplifier. The turning on of NMOS N43 and N44 also clears the drains of N41 and N42 of charge to prepare the strong-arm latch for the next sampling interval.

Figure 5:
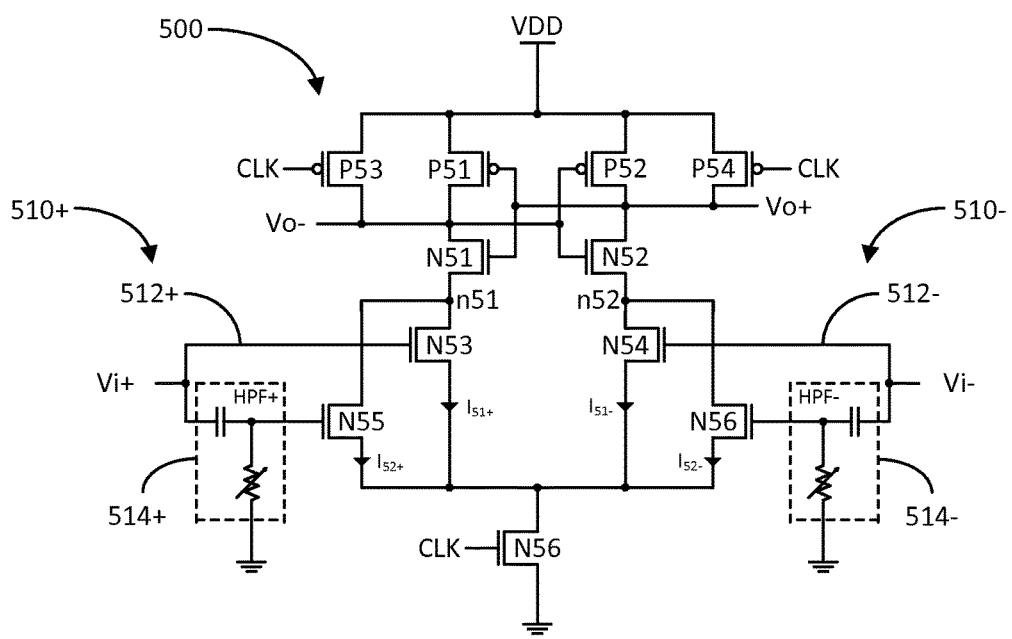
FIG. 5 illustrates a schematic diagram of another exemplary receiving device in accordance with another aspect of the disclosure.

FIG. 5 illustrates a schematic diagram of another exemplary receiving device 500 in accordance with another aspect of the disclosure. The receiving device 400, previously discussed, includes a p-version sense amplifier as the input signal is applied to the gates of PMOS P42, P43, P44, and P45. A p-version sense amplifier may be more suitable when the input signal has a relatively low common mode voltage. The receiving device 500 includes an n-version sense amplifier, which may be more suitable when the input signal has a relatively high common mode voltage.

As in the previous embodiment, a differential input data signal including a positive component Vi+ and a negative component Vi− is applied to the receiving device 500. The receiving device 500 includes a passive equalizer having a positive equalizer component 510+ and a negative equalizer component 510−. The positive equalizer component 510+ includes a positive-side all-pass path 512+ and a positive-side high-pass filter (HPF) 514+, both of which are configured to receive the positive component Vi+ of the input differential signal. The negative equalizer component 510− includes a negative-side all-pass path 512− and a negative-side high-pass filter (HPF) 514−, both of which are configured to receive the negative component Vi− of the input differential signal.

The receiving device 500 further includes a sense amplifier including an input circuit and a data detection circuit (e.g., a strong-arm latch). The input circuit includes NMOS N53, N54, N55, and N56. The NMOS N53 and N55 include drains coupled together, and sources coupled together. The NMOS N53 includes a gate configured to receive the positive component Vi+ of the input differential signal via the all-pass path 512+. The NMOS N55 includes a gate configured to receive the high-pass filtered positive component of the input differential signal via the HPF 514+. The NMOS N54 and N56 include drains coupled together, and sources coupled together. The NMOS N54 includes a gate configured to receive the negative component Vi− of the input differential signal via the all-pass path 512−. The NMOS N56 includes a gate configured to receive the high-pass filtered negative component of the input differential signal via the HPF 514−.

The strong-arm latch includes cross-coupled inverters having transistors P51-N51 and P52-N52, respectively. The inverters are cross-coupled because the output of inverter P51-N51 (at the drains of these devices) is coupled to the input of inverter P52-N52 (at the gates of these devices), and the output of inverter P52-N52 (at the drains of these devices) is coupled to the input of inverter P51-N51 (at the gates of these devices). The sources of PMOS P51 and P52 are coupled to a positive voltage rail VDD. The sources of NMOS N51 and N52 are coupled to nodes n51 and n52, respectively. The strong-arm latch is configured to generate an output differential data signal with positive and negative components Vo+ and Vo− at the outputs of the inverters P52-N52 and P51-N51, respectively.

The receiving device 500 further includes circuitry for selectively enabling the operation of the input circuit (NMOS N53-N56) and the strong-arm latch (PMOS P51 and P52, and NMOS N51 and N52) based on a clock signal CLK. The enabling/disabling circuitry includes PMOS P53 and P54, and NMOS N56. The PMOS P53 and P54 include sources coupled to VDD, gates configured to receive the clock signal CLK, and drains coupled to the drains of PMOS P51 and P52, respectively. NMOS N56 includes a drain coupled to the sources of NMOS N53-N56, a gate configured to receive the clock signal CLK, and a source coupled to ground.

In operation, the positive and negative components Vi+ and Vi− of the input differential data signal are applied to the positive and negative components 510+ and 510− of the passive equalizer, respectively. When the sense amplifier is not sampling the input signal, the clock signal CLK is in a deasserted state (e.g., a low logic voltage (e.g., ~ground)).

The clock signal CLK being in the deasserted state causes NMOS N56 to be off, and PMOS P53 and N54 to be on. The NMOS N56 being off prevents the formation of the currents $I_{51+}$, $I_{51-}$, $I_{52+}$, and $I_{52-}$ by the NMOS N53, N54, N55, and N56, respectively. The PMOS P53 and P54 being on produce substantially VDD at the drains of PMOS P51 and P52.

For the sense amplifier to sample the input signal, the clock signal CLK is brought to its asserted state (e.g., a high logic voltage (e.g., VDD)). The clock signal CLK being at a high logic voltage causes NMOS N56 to turn on, and apply ground to the sources of NMOS N53-N56. Also, the clock signal CLK being at a high logic voltage causes PMOS P53 and P54 to turn off, and allow the drains of the PMOS P51 and P52 to be discharged. Also, as the gates of NMOS N51 and N52 were previously at VDD, and now lower voltages are applied to the sources of NMOS N51 and N52 via NMOS N53/N55 and N54/N56, respectively, the NMOS N51 and N52 turn on.

Accordingly, NMOS N53 generates a current $I_{51+}$ based on the positive component Vi+ of the input signal. NMOS N55 generates a current $I_{52+}$ based on the high-pass filtered positive component of the input signal. NMOS N54 generates a current $I_{51-}$ based on the negative component Vi− of the input signal. And, NMOS N56 generates a current $I_{52-}$ based on the high-pass filtered negative component of the input signal. The currents $I_{51+}$ and $I_{52+}$ are summed at node n51, and the currents $I_{51-}$ and $I_{52-}$ are summed at node n52. The differential signal including the positive-side summed currents $I_{51+}$ and $I_{52+}$ and the negative-side summed currents $I_{51-}$ and $I_{52-}$ is the input signal having undergone the equalization produced by the passive equalizer 510+/510−. The summed currents $I_{51+}$ and $I_{52+}$ discharge the drain of PMOS N51, and the summed currents $I_{51-}$ and $I_{52-}$ discharge of drain of PMOS P52.

Due to the positive feedback configuration of the cross-coupled inverters P51-N51 and P52-N52, the drain of PMOS P51 or P52 that discharges faster due to a higher corresponding current $(I_{51+}+I_{52+})$ or $(I_{51-}+I_{52-})$ causes the strong-arm latch to generate a low logic voltage at such drain and a high logic voltage at the other drain. In other words, the positive and negative components Vo+ and Vo− of the output signal may be given by the following relationship:

Vo+ is high and Vo− is low if $(I_{51+}+I_{52+})>(I_{51-}+I_{52-})$; or
Vo+ is low and Vo− is high if $(I_{51+}+I_{52+})<(I_{51-}+I_{52-})$.

Once the strong-arm latch has detected or generated the data, another latch (not shown in FIG. 5) may be operated to read the data from the positive and negative outputs of the strong-arm latch. The clock signal CLK is thereafter brought to its deasserted state to turn off NMOS N56 and turn on PMOS P53 and P54 to disable the sampling or slicing operation of the sense amplifier. The turning on of PMOS P53 and P54 recharges the drains of P51 and P52 to prepare the strong-arm latch for the next sampling interval.

Figure 6:
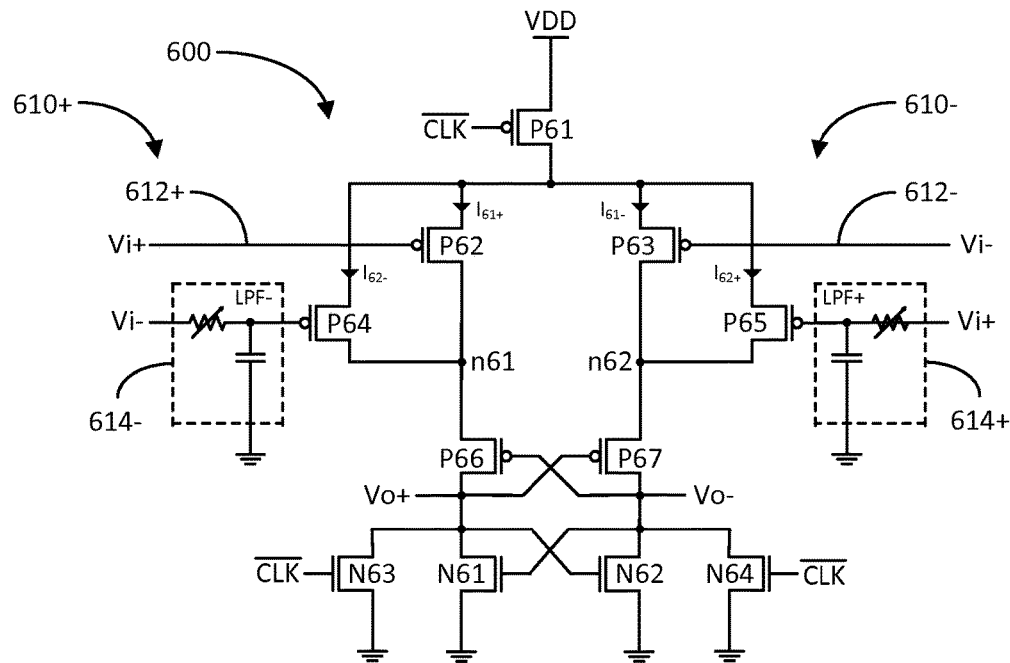
FIG. 6 illustrates a schematic diagram of another exemplary receiving device in accordance with another aspect of the disclosure.

FIG. 6 illustrates a schematic diagram of another exemplary receiving device 600 in accordance with another aspect of the disclosure. The receiving device 600 is similar to the receiving device 400 previously discussed, except that the receiving device 600 includes a low-pass filter (LPF)-based passive equalizer, instead of a HPF-based passive equalizer.

In particular, the receiving device 600 includes a passive equalizer having a positive equalizer component 610+ and a negative equalizer component 610−. The positive equalizer component 610+ includes a positive-side all-pass path 612+ configured to receive a positive component Vi+ of an input differential data signal, and a negative-side low-pass filter (LPF) 614− configured to receive a negative component Vi− of the input differential data signal. The negative equalizer component 610− includes a negative-side all-pass path 612− configured to receive the negative component Vi− of the input differential signal, and a positive-side low-pass filter (LPF) 614+ configured to receive the positive component Vi+ of the input differential signal.

The receiving device 600 further includes a sense amplifier having an input circuit and a data detection circuit (e.g., a strong-arm latch). The input circuit includes PMOS P62, P63, P64, and P65 having sources coupled together. PMOS P62 and P64 include drains coupled together at a node n61. PMOS P63 and P65 include drains coupled together at node n62. The PMOS P62 includes a gate configured to receive the positive component Vi+ of the input differential signal via the all-pass path 612+. The PMOS P63 includes a gate configured to receive the negative component Vi− of the input differential signal via the all-pass path 612−. The PMOS P64 includes a gate configured to receive the low-pass filtered negative component of the input differential signal via the LPF 614−. And, the PMOS P65 includes a gate configured to receive the low-pass filtered positive component of the input differential signal via the LPF 614+.

The strong-arm latch includes cross-coupled inverters P66-N61 and P67-N62, respectively. The receiving device 600 further includes circuitry to selectively enable the input circuit and the strong-arm latch based on a clock signal CLK. The enable/disable circuitry includes PMOS P61, and NMOS N63 and N64.

The operation of the receiving device 600 is similar to that of receiving device 400, previously discussed. That is, when the clock signal $\overline{CLK}$ is deasserted, PMOS P61 is off to prevent the formation of currents by PMOS P62-P65, and NMOS N63 and N64 are on to ground and completely discharge the drains of the latch NMOS N61 and N62. When the clock signal $\overline{CLK}$ is asserted, PMOS P61 turns on and applies VDD to the sources of PMOS P62-P65, and NMOS N63 and N64 turn off to allow the charging of the drains of the latch NMOS N61 and N62.

PMOS P62 generates a current $I_{61+}$ based on the positive component Vi+ of the input differential signal. PMOS P63 generates a current $I_{61-}$ based on the negative component Vi− of the input differential signal. PMOS P64 generates a current $I_{62-}$ based on the low-pass filtered negative component of the input differential signal. And, PMOS P65 generates a current $I_{62+}$ based on the low-pass filtered positive component of the input differential signal. The currents $I_{61+}$ and $I_{62-}$ are summed at node n61 and the currents $I_{61-}$ and $I_{62+}$ are summed at node n62. Since the summed currents at nodes n61 and n62 are respectively based on opposite polarities of the input signal, the differential signal at nodes n61 and n62 is based on the difference of the outputs of the all-pass path and the LPF. Accordingly, the differential signal including the positive-side summed currents $I_{61+}$ and $I_{62-}$ and the negative-side summed currents $I_{61-}$ and $I_{62+}$ is the input signal having undergone the equalization produced by the passive equalizer 610+/610−.

The summed currents $I_{61+}$ and $I_{62-}$ charge the drain of NMOS N61 and the summed currents $I_{61-}$ and $I_{62+}$ charge the drain of NMOS N62. The drain of NMOS N61 or N62 that charges faster due to a higher corresponding current $(I_{61+}+I_{62+})$ or $(I_{61-}+I_{62+})$ causes the strong-arm latch to generate a high logic voltage at such drain and a low logic voltage at the other drain. In other words, the positive and negative components Vo+ and Vo− of the output signal may be given by the following relationship:

Vo+ is high and Vo− is low if $(I_{61+}+I_{62-})>(I_{61-}+I_{62+})$; or
Vo+ is low and Vo− is high if $(I_{61+}+I_{62+})<(I_{61-}+I_{62+})$.

Once the strong-arm latch has detected or generated the data, another latch (not shown in FIG. 6) may be operated to read the data from the positive and negative outputs of the strong-arm latch. The clock signal CLK is thereafter brought to its deasserted state to turn off PMOS P61 and turn on NMOS N63 and N64 to disable the sampling or slicing operation of the sense amplifier. The NMOS N63 and N64 being turned on clears the charge on the drains of NMOS N61 and N62 to prepare the strong-arm latch for the next sampling interval.

Figure 7:
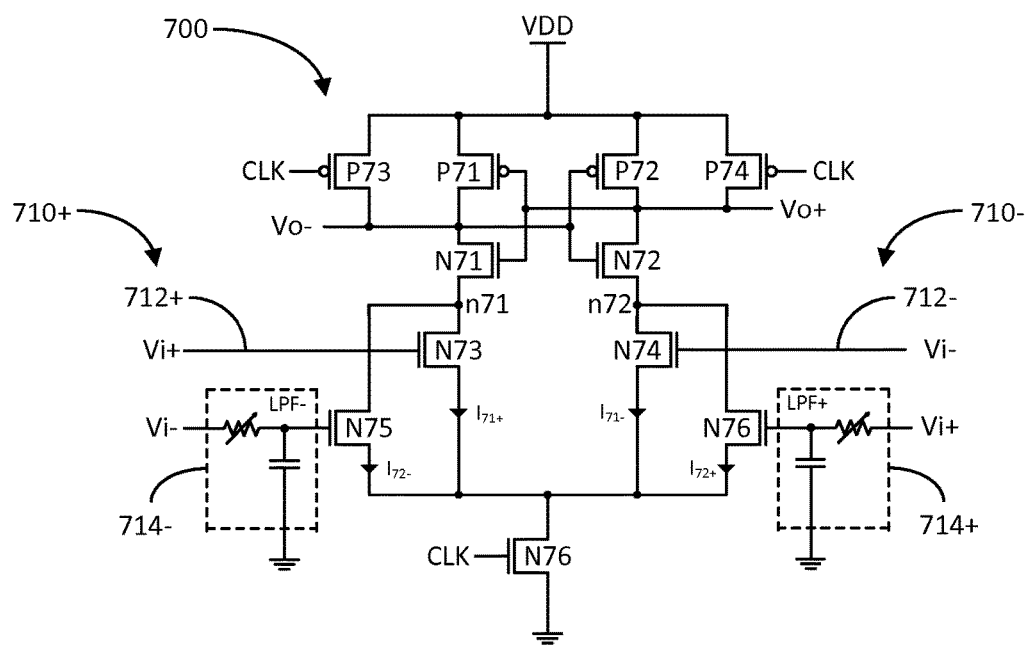
FIG. 7 illustrates a schematic diagram of another exemplary receiving device in accordance with another aspect of the disclosure.

FIG. 7 illustrates a schematic diagram of another exemplary receiving device 700 in accordance with another aspect of the disclosure. The receiving device 700 is similar to the receiving device 500 previously discussed, except that the receiving device 700 employs a low-pass filter (LPF)-based passive equalizer, instead of a HPF-based passive equalizer.

In particular, the receiving device 700 includes a passive equalizer having a positive equalizer component 710+ and a negative equalizer component 710−. The positive equalizer component 710+ includes a positive-side all-pass path 712+ configured to receive a positive component Vi+ of an input differential data signal, and a negative-side low-pass filter (LPF) 714− configured to receive a negative component Vi− of the input differential data signal. The negative equalizer component 710− includes a negative-side all-pass path 712− configured to receive the negative component Vi− of the input differential signal, and a positive-side low-pass filter (LPF) 714+ configured to receive the positive component Vi+ of the input differential signal.

The receiving device 700 further includes a sense amplifier having an input circuit and a data detection circuit (e.g., strong-arm latch). The input circuit includes NMOS N73, N74, N75, and N76 having sources coupled together. NMOS N73 and N75 include drains coupled together at a node n71. NMOS N74 and N76 include drains coupled together at node n72. The NMOS N73 includes a gate configured to receive the positive component Vi+ of the input differential signal via the all-pass path 712+. The NMOS N74 includes a gate configured to receive the negative component Vi− of the input differential signal via the all-pass path 712−. The NMOS N75 includes a gate configured to receive the low-pass filtered negative component of the input differential signal via the LPF 714−. And, the NMOS N76 includes a gate configured to receive the low-pass filtered positive component of the input differential signal via the LPF 714+.

The strong-arm latch includes cross-coupled inverters P71-N71 and P72-N72, respectively. The receiving device 700 further includes circuitry to selectively enable the input circuit and the strong-arm latch based on a clock signal CLK. The enable/disable circuitry includes NMOS N76, and PMOS P73 and P74.

The operation of the receiving device 700 is similar to that of receiving device 500, previously discussed. That is, when the clock signal CLK is deasserted, NMOS N76 is off to prevent the formation of currents by NMOS N73-N76, and PMOS P73 and P74 are on to apply VDD to and charge the drains of the latch PMOS P71 and P72. When the clock signal CLK is asserted, NMOS N76 turns on and applies ground to the sources of NMOS N73-N76, and PMOS P73 and P74 turn off to allow the discharging of the drains of the latch PMOS P71 and P72.

NMOS N73 generates a current $I_{71+}$ based on the positive component Vi+ of the input differential signal. NMOS N74 generates a current $I_{71-}$ based on the negative component Vi− of the input differential signal. NMOS N75 generates a current $I_{72-}$ based on the low-pass filtered negative component of the input differential signal. And, NMOS N76 generates a current $I_{72+}$ based on the low-pass filtered positive component of the input differential signal. The currents $I_{71+}$ and $I_{72-}$ are summed at node n71 and the currents $I_{71-}$ and $I_{72+}$ are summed at node n72. Since the summed currents at nodes n71 and n72 are respectively based on opposite polarities of the input signal, the differential signal at nodes n71 and n72 is based on the difference of the outputs of the all-pass path and the LPF. Accordingly, the differential signal including the positive-side summed currents $I_{71+}$ and $I_{72-}$ and the negative-side summed currents $I_{71-}$ and $I_{72+}$ is the input signal having undergone the equalization produced by the passive equalizer 710+/710−.

The summed currents $I_{71+}$ and $I_{72-}$ discharge the drain of PMOS P71 and the summed currents $I_{71-}$ and $I_{72+}$ discharge the drain of PMOS P72. The drain of PMOS P71 or P72 that discharges faster due to a higher corresponding current $(I_{71+}+I_{72-})$ or $(I_{71-}+I_{72+})$ causes the latch to generate a low logic voltage at such drain and a high logic voltage at the other drain. In other words, the positive and negative components Vo+ and Vo− of the output signal may be given by the following relationship:

Vo+ is high and Vo− is low if $(I_{71+}+I_{72-})>(I_{71-}+I_{72+})$; or
Vo+ is low and Vo− is high if $(I_{71+}+I_{72-})>(I_{71-}+I_{72+})$;

Once the strong-arm latch has detected or generated the data, another latch (not shown in FIG. 7) may be operated to read the data from the positive and negative outputs of the strong-arm latch. The clock signal CLK is thereafter brought to its deasserted state to turn off NMOS N76 and turn on PMOS P73 and P74 to disable the sampling or slicing operation of the sense amplifier. The PMOS P73 and P74 being turned on recharges the drains of PMOS P71 and P72 to prepare the strong-arm latch for the next sampling interval.

Figure 8A:
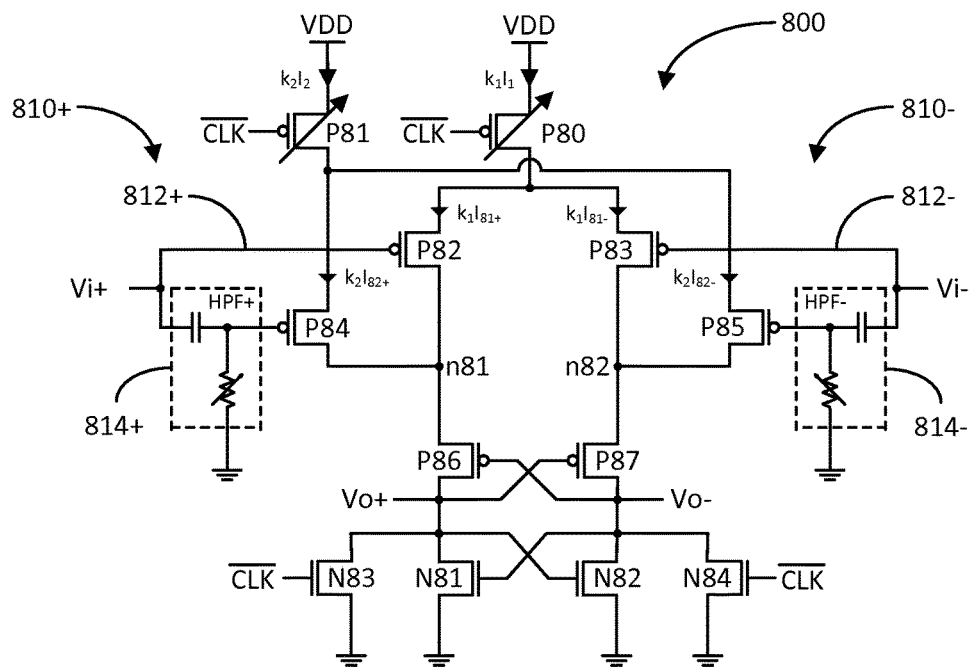
FIGS. 8A-8B illustrate schematic diagrams of other exemplary receiving devices in accordance with another aspect of the disclosure.

FIG. 8A illustrates a schematic diagram of another exemplary receiving device 800 in accordance with another aspect of the disclosure. The receiving device 800 is similar to the receiving device 400 previously discussed, except that the receiving device 800 includes separate and variable transistors for supplying separate weighted currents to the respective portions of the input circuit associated with the all-pass path and the filtered path.

In particular, the receiving device 800 includes a passive equalizer having a positive equalizer component 810+ and a negative equalizer component 810−. The positive equalizer component 810+ includes a positive-side all-pass path 812+ and a positive-side high-pass filter 814+, both of which are configured to receive a positive component Vi+ of an input differential data signal. The negative equalizer component 810− includes a negative-side all-pass path 812− and a negative-side high-pass filter 814−, both of which are configured to receive a negative component Vi− of an input differential data signal.

The receiving device 800 further includes a sense amplifier having an input circuit and a data detection circuit (e.g., a strong-arm latch). The input circuit includes PMOS P82, P83, P84, and P85. PMOS P82 and P83 include sources coupled together. PMOS P84 and P85 include sources coupled together. PMOS P82 and P84 include drains coupled together at a node n81. PMOS P83 and P85 include drains coupled together at node n82. The PMOS P82 includes a gate configured to receive the positive component Vi+ of the input differential signal via the all-pass path 812+. The PMOS P83 includes a gate configured to receive the negative component Vi− of the input differential signal via the all-pass path 812−. The PMOS P84 includes a gate configured to receive the high-pass filtered positive component of the input differential signal via the HPF 814+. And, the PMOS P85 includes a gate configured to receive the high-pass filtered negative component of the input differential signal via the HPF 814−.

The strong-arm latch includes cross-coupled inverters P86-N81 and P87-N82, respectively. The receiving device 800 further includes circuitry to selectively enable the input circuit and the strong-arm latch based on a clock signal $\overline{CLK}$. The enable/disable circuitry includes PMOS P80 and P81, and NMOS N83 and N84.

In this example, the PMOS P80 is configured to generate a weighted current $k_1I_1$ for supplying current to the input PMOS P82 and P83 associated with the all-pass path. As shown, the PMOS P80 may be made to have a variable transconductance gain to set the weight $k_1$ of the weighted current $k_1I_1$. Similarly, the PMOS P81 is configured to generate a weighted current $k_2I_2$ for supplying current to the input PMOS P84 and P85 associated with the filtered path. As shown, the PMOS P81 may be made to have a variable transconductance gain to set the weight $k_2$ of the weighted current $k_2I_2$.

The operation of the receiving device 800 is similar to that of receiving device 400, previously discussed. That is, when the clock signal $\overline{CLK}$ is deasserted, PMOS P80 and P81 are off to prevent the formation of respective currents by PMOS P82-P83 and P84-P85, and NMOS N83 and N84 are on to ground and completely discharge the drains of the latch NMOS N81 and N82. When the clock signal $\overline{CLK}$ is asserted, PMOS P80 and P81 turn on and apply VDD to the respective sources of PMOS P82-P83 and P84-P85, and NMOS N83 and N84 turn off to allow the charging of the drains of the latch NMOS N81 and N82.

PMOS P82 generates a current $k_1I_{81+}$ based on the positive component Vi+ of the input differential signal. PMOS P83 generates a current $k_1I_{81-}$ based on the negative component Vi− of the input differential signal. PMOS P84 generates a current $k_2I_{82+}$ based on the high-pass filtered positive component of the input differential signal. And, PMOS P85 generates a current $k_2I_{82-}$ based on the high-pass filtered negative component of the input differential signal. The currents $k_1I_{81+}$ and $k_2I_{82+}$ are summed at node n81 and the currents $k_1I_{81-}$ and $k_2I_{82-}$ are summed at node n82. Accordingly, the differential signal including the positive-side summed currents $k_1I_{81+}$ and $k_2I_{82+}$ and the negative-side summed currents $k_1I_{81-}$ and $k_2I_{82-}$ is the input signal having undergone the equalization produced by the passive equalizer 810+/810−.

The summed currents $k_1I_{81+}$ and $k_2I_{82+}$ charge the drain of NMOS N81 and the summed currents $k_1I_{81-}$ and $k_2I_{82-}$ charge the drain of NMOS N82. The drain of NMOS N81 or N82 that charges faster due to a higher corresponding current $(k_1I_{81+}+k_2I_{82+})$ or $(k_1I_{81-}+k_2I_{82-})$ causes the strong-arm latch to generate a high logic voltage at such drain and a low logic voltage at the other drain. In other words, the positive and negative components Vo+ and Vo− of the output signal may be given by the following relationship:

Vo+ is high and Vo− is low if $(k_1I_{81+}+k_2I_{82+})>(k_1I_{81-}+k_2I_{82-})$; or Vo+ is low and Vo− is high if $(k_1I_{81+}+k_2I_{82+})<(k_1I_{81-}+k_2I_{82-})$.

Once the strong-arm latch has detected or generated the data, another latch (not shown in FIG. 8A) may be operated to read the data from the positive and negative outputs of the strong-arm latch. The clock signal CLK is thereafter brought to its deasserted state to turn off PMOS P80 and P81 and turn on NMOS N83 and N84 to disable the sampling or slicing operation of the sense amplifier. The NMOS N83 and N84 being turned on clears the charge on the drains of NMOS N81 and N82 to prepare the strong-arm latch for the next sampling interval.

Figure 8B:
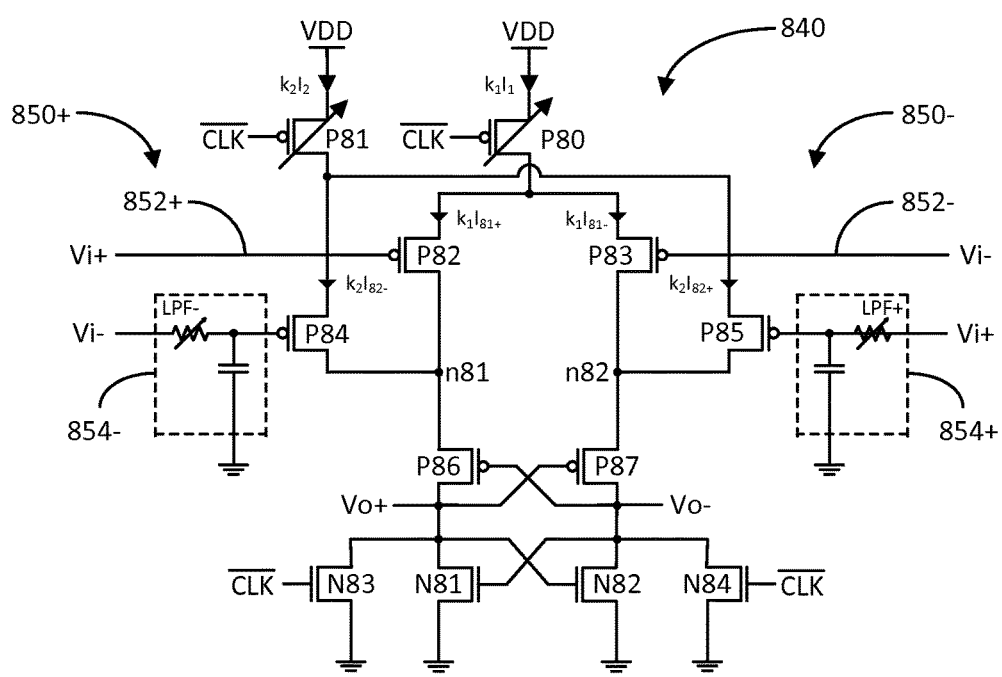

FIG. 8B illustrates a schematic diagram of another exemplary receiving device 840 in accordance with another aspect of the disclosure. The receiving device 840 is similar to that of receiving device 800, but includes an LPF-based passive equalizer instead of an HPF-based passive equalizer.

In this regard, the receiving device 840 includes a positive passive equalizer component 850+ and a negative passive equalizer component 850−. The positive passive equalizer component 850+, in turn, includes a positive-side all-pass path 852+ and a negative-side LPF 854−. The negative passive equalizer component 850−, in turn, includes a negative-side all-pass path 852− and a positive-side LPF 854+. The positive component Vi+ of the input signal is applied to the positive-side all-pass path 852+ and the positive-side LPF 854+. The negative component Vi− of the input signal is applied to the negative-side all-pass path 852− and the negative-side LPF 854−.

PMOS P82 generates a current $k_1I_{81+}$ based on the positive component Vi+ of the input differential signal. PMOS P83 generates a current $k_1I_{81-}$ based on the negative component Vi− of the input differential signal. PMOS P84 generates a current $k_2I_{82-}$ based on the low-pass filtered negative component of the input differential signal. And, PMOS P85 generates a current $k_2I_{82+}$ based on the low-pass filtered positive component of the input differential signal. The currents $k_1I_{81+}$ and $k_2I_{82-}$ are summed at node n81 and the currents $k_1I_{81-}$ and $k_2I_{82+}$ are summed at node n82.

Since the summed currents at nodes n81 and n82 are respectively based on opposite polarities of the input signal, the differential signal at nodes n81 and n82 is based on the difference of the outputs of the all-pass path and the LPF. Accordingly, the differential signal including the positive-side summed currents $k_1I_{81+}$ and $k_2I_{82-}$ and the negative-side summed currents $k_1I_{81-}$ and $k_2I_{82+}$ is the input signal having undergone the equalization produced by the passive equalizer 850+/850−.

In this configuration, the positive and negative components Vo+ and Vo− of the output signal may be given by the following relationship:

Vo+ is high and Vo− is low if $(k_1I_{81+}+k_2I_{82-})>(k_1I_{81-}+k_2I_{82+})$; or Vo+ is low and Vo− is high if $(k_1I_{81+}+k_2I_{82-})<(k_1I_{81-}+k_2I_{82+})$.

Figure 9A:
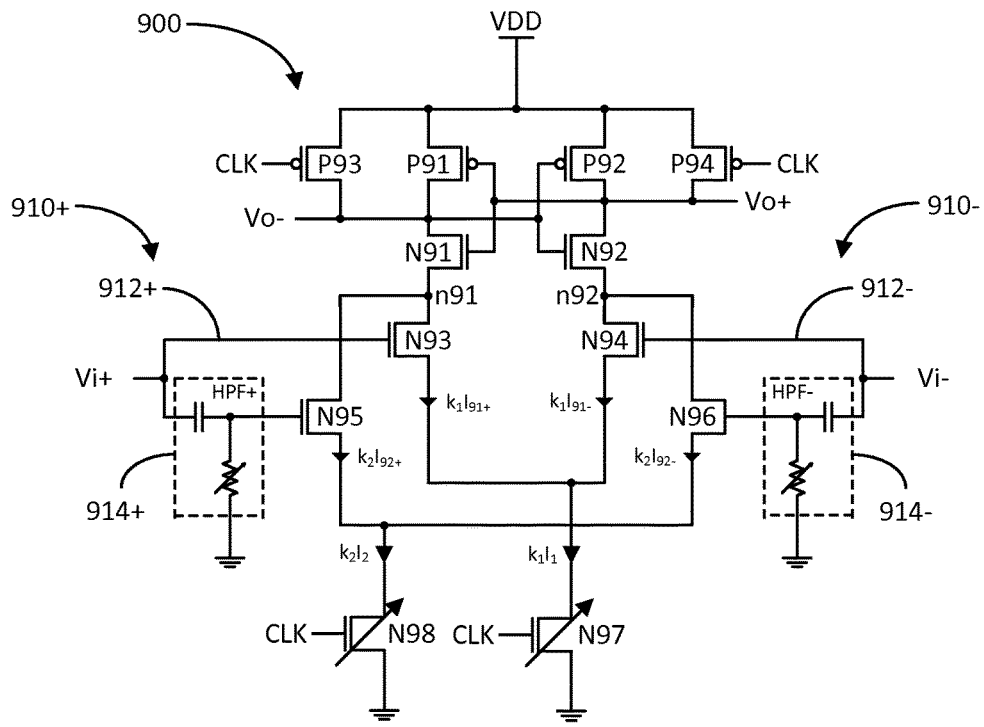
FIGS. 9A-9B illustrate schematic diagrams of yet other exemplary receiving devices in accordance with another aspect of the disclosure.

FIG. 9A illustrates a schematic diagram of another exemplary receiving device 900 in accordance with another aspect of the disclosure. The receiving device 900 is similar to the receiving device 500 previously discussed, except that the receiving device 900 includes separate and variable transistors for generating separate weighted currents to the respective portions of the input circuit associated with the all-pass path and the filtered path.

In particular, the receiving device 900 includes a passive equalizer having a positive equalizer component 910+ and a negative equalizer component 910−. The positive equalizer component 910+ includes a positive-side all-pass path 912+ and a positive-side high-pass filter 914+, both of which are configured to receive a positive component Vi+ of an input differential data signal. The negative equalizer component 910− includes a negative-side all-pass path 912− and a negative-side high-pass filter 914−, both of which are configured to receive a negative component Vi− of an input differential data signal.

The receiving device 900 further includes a sense amplifier having an input circuit and a data detection circuit (e.g., a strong-arm latch). The input circuit includes NMOS N93, N94, N95, and N96. NMOS N93 and N94 include sources coupled together. NMOS N95 and N96 include sources coupled together. NMOS N93 and N95 include drains coupled together at a node n91. NMOS N94 and N96 include drains coupled together at node n92. The NMOS N93 includes a gate configured to receive the positive component Vi+ of the input differential signal via the all-pass path 912+. The NMOS N94 includes a gate configured to receive the negative component Vi− of the input differential signal via the all-pass path 912−. The NMOS N95 includes a gate configured to receive the high-pass filtered positive component of the input differential signal via the HPF 914+. And, the NMOS N96 includes a gate configured to receive the high-pass filtered negative component of the input differential signal via the HPF 914−.

The strong-arm latch includes cross-coupled inverters P91-N91 and P92-N92, respectively. The receiving device 900 further includes circuitry to selectively enable the input circuit and the strong-arm latch based on a clock signal CLK. The enable/disable circuitry includes PMOS P93 and P94, and NMOS N97 and N98.

In this example, the NMOS N97 is configured to generate a weighted current $k_1I_1$ for generating currents through NMOS N93 and N94 associated with the all-pass path. As shown, the NMOS N97 may be made to have a variable transconductance gain to set the weight $k_1$ of the weighted current $k_1I_1$. Similarly, the NMOS N98 is configured to generate a weighted current $k_2I_2$ for generating currents through NMOS N95 and N96 associated with the filtered path. As shown, the NMOS N98 may be made to have a variable transconductance gain to set the weight $k_2$ of the weighted current $k_2I_2$.

The operation of the receiving device 900 is similar to that of receiving device 500, previously discussed. That is, when the clock signal CLK is deasserted, NMOS N97 and N98 are off to prevent the formation of respective currents by NMOS N93-N94 and N95-N96, and PMOS P93 and P94 are on to apply VDD to and charge the drains of the latch PMOS P91 and P92. When the clock signal CLK is asserted, NMOS N97 and N98 turn on and couple ground to the respective sources of NMOS N93-N94 and N95-N96, and PMOS P93 and P94 turn off to allow the discharging of the drains of the latch PMOS P91 and P92.

NMOS N93 generates a current $k_1I_{91+}$ based on the positive component Vi+ of the input differential signal. NMOS N94 generates a current $k_1I_{91-}$ based on the negative component Vi− of the input differential signal. NMOS N95 generates a current $k_2I_{92+}$ based on the high-pass filtered positive component of the input differential signal. And, NMOS N96 generates a current $k_2I_{92-}$ based on the high-pass filtered negative component of the input differential signal. The summed currents $k_1I_{91+}$ and $k_2I_{92+}$ are generated at node n91 and the summed currents $k_1I_{91-}$ and $k_2I_{92-}$ are generated at node n92. Accordingly, the differential signal including the positive-side summed currents $k_1I_{91+}$ and $k_2I_{92+}$ and the negative-side summed currents $k_1I_{91-}$ and $k_2I_{92-}$ is the input signal having undergone the equalization produced by the passive equalizer 910+/910−.

The summed currents $k_1I_{91+}$ and $k_2I_{92+}$ discharge the drain of PMOS P91 and the summed currents $k_1I_{91-}$ and $k_2I_{92-}$ discharge the drain of PMOS P92. The drain of PMOS P91 or P92 that discharges faster due to a higher corresponding current $(k_1I_{91+}+k_2I_{92+})$ or $(k_1I_{91-}+k_2I_{92-})$ causes the strong-arm latch to generate a low logic voltage at such drain and a high logic voltage at the other drain. In other words, the positive and negative components Vo+ and Vo− of the output signal may be given by the following relationship:

Vo+ is high and Vo− is low if $(k_1I_{91+}+k_2I_{92+})>(k_1I_{91-}+k_2I_{92-})$; or Vo+ is low and Vo− is high if $(k_1I_{91+}+k_2I_{92+})<(k_1I_{91-}+k_2I_{92-})$.

Once the strong-arm latch has detected or generated the data, another latch (not shown in FIG. 9A) may be operated to read the data from the positive and negative outputs of the strong-arm latch. The clock signal CLK is thereafter brought to its deasserted state to turn off NMOS N97 and N98 and turn on PMOS P93 and P94 to disable the sampling or slicing operation of the sense amplifier. The PMOS P93 and P94 being turned on recharge the drains of PMOS P91 and P92 to prepare the strong-arm latch for the next sampling interval.

Figure 9B:
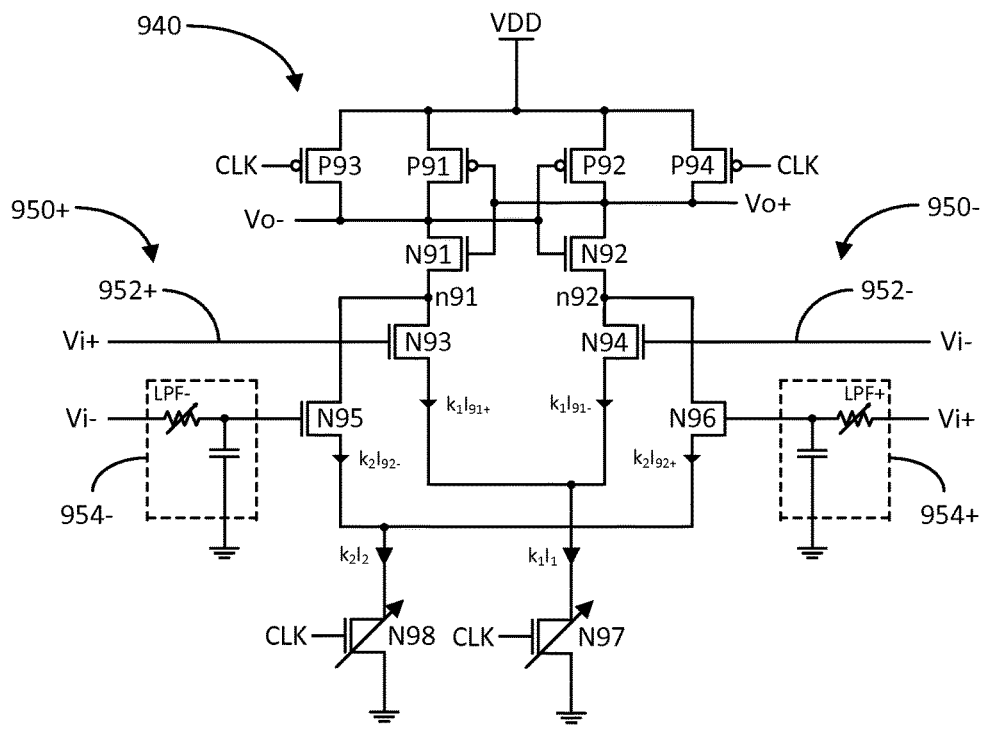

FIG. 9B illustrates a schematic diagram of another exemplary receiving device 940 in accordance with another aspect of the disclosure. The receiving device 940 is similar to that of receiving device 900, but includes an LPF-based passive equalizer instead of an HPF-based passive equalizer.

In this regard, the receiving device 940 includes a positive passive equalizer component 950+ and a negative passive equalizer component 950−. The positive passive equalizer component 950+, in turn, includes a positive-side all-pass path 952+ and a negative-side LPF 954−. The negative passive equalizer component 950−, in turn, includes a negative-side all-pass path 952− and a positive-side LPF 954+. The positive component Vi+ of the input signal is applied to the positive-side all-pass path 952+ and the positive-side LPF 954+. The negative component Vi− of the input signal is applied to the negative-side all-pass path 952− and the negative-side LPF 954−.

NMOS N93 generates a current $k_1I_{91+}$ based on the positive component Vi+ of the input differential signal. NMOS N94 generates a current $k_1I_{91-}$ based on the negative component Vi− of the input differential signal. NMOS N95 generates a current $k_2I_{92-}$ based on the low-pass filtered negative component of the input differential signal. And, NMOS N96 generates a current $k_2I_{92+}$ based on the low-pass filtered positive component of the input differential signal. The currents $k_1I_{91+}$ and $k_2I_{92-}$ are summed at node n91 and the currents $k_1I_{91-}$ and $k_2I_{92+}$ are summed at node n92.

Since the summed currents at nodes n91 and n92 are respectively based on opposite polarities of the input signal, the differential signal at nodes n91 and n92 is based on the difference of the outputs of the all-pass path and the LPF. Accordingly, the differential signal including the positive-side summed currents $k_1I_{91+}$ and $k_2I_{92-}$ and the negative-side summed currents $k_1I_{91-}$ and $k_2I_{92+}$ is the input signal having undergone the equalization produced by the passive equalizer 950+/950−.

In this configuration, the positive and negative components Vo+ and Vo− of the output signal may be given by the following relationship:

Vo+ is high and Vo− is low if $(k_1I_{91+}+k_2I_{92})>(k_1I_{91-}+k_2I_{92+})$; or Vo+ is low and Vo− is high if $(k_1I_{91+}+k_2I_{92})<(k_1I_{91-}+k_2I_{92+})$.

Figure 10:
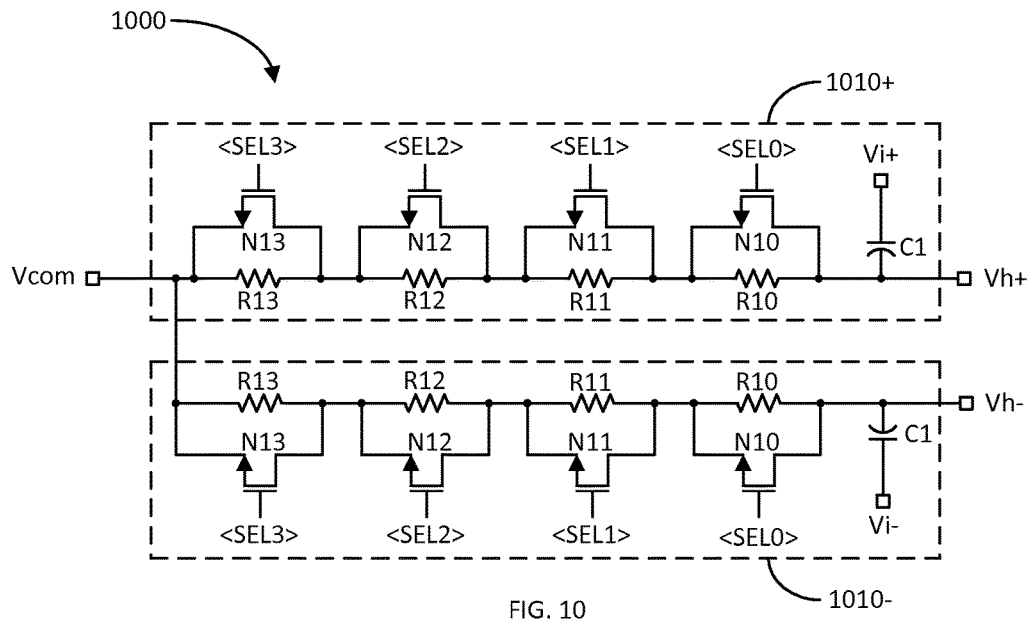
FIG. 10 illustrates a schematic diagram of an exemplary programmable high-pass filter (HPF) in accordance with another aspect of the disclosure.

FIG. 10 illustrates a schematic diagram of an exemplary programmable high-pass filter (HPF) 1000 in accordance with another aspect of the disclosure. The HPF 1000 may be an exemplary detailed implementation of any of the HPF described herein. The HPF 1000 includes a positive component 1010+ configured to high-pass filter a positive component Vi+ of an input differential data signal to generate a positive component Vh+ of a filtered differential signal. The HPF 1000 includes a negative component 1010− configured to high-pass filter a negative component Vi− of the input differential data signal to generate a negative component Vh− of the filtered signal. The positive and negative components Vh+ and Vh− of the filtered signal are applied to corresponding transistors of an input circuit of a sense amplifier, as previously discussed.

The positive component 1010+ of the HPF 1000 includes a capacitor C1 coupled in series with a set of selectable resistors R10, R11, R12, and R13 between a first port configured to receive the positive component Vi+ of the input differential signal and a second port configured to receive a common mode voltage Vcom. To make the set of resistors selectable, the positive HPF component 1010+ includes a corresponding set of switches N10, N11, N12, and N13 coupled in parallel with the resistors R10, R11, R12, and R13, respectively. In this example, the switches N10, N11, N12, and N13 are configured as NMOS devices, but may be configured as PMOS devices as well. A set of control signals SEL0, SEL1, SEL2, and SEL3 are applied to the gates of the switches N10, N11, N12, and N13 to control their respective on or off states. Thus, the frequency response of the positive component 1010+ of the HPF 1000 may be configured via the control signals SEL0, SEL1, SEL2, and SEL3.

Similarly, the negative component 1010− of the HPF 1000 includes a capacitor C1 coupled in series with a set of selectable resistors R10, R11, R12, and R13 between a third port configured to receive the negative component Vi− of the input differential signal and the second port configured to receive the common mode voltage Vcom. To make the set of resistors selectable, the negative HPF component 1010− includes a corresponding set of switches N10, N11, N12, and N13 coupled in parallel with the resistors R10, R11, R12, and R13, respectively. In this example, the switches N10, N11, N12, and N13 are configured as NMOS devices, but may be configured as PMOS devices as well. A set of control signals SEL0, SEL1, SEL2, and SEL3 are applied to the gates of the switches N10, N11, N12, and N13 to control their respective on or off states. Thus, the frequency response of the negative component 1010− of the HPF 1000 may be configured via the control signals SEL0, SEL1, SEL2, and SEL3.

The positive component Vh+ and negative component Vh− of the filtered signal are generated at the corresponding nodes between the corresponding capacitor C1 and corresponding resistor R10. Generally, the capacitors C1 of the positive and negative components 1010+ and 1010− are configured to have substantially the same capacitance. Similarly, the resistors R10, R11, R12, and R13 of the positive and negative components 1010+ and 1010− are configured to have substantially the same resistance, respectively. Also, the control signals SEL0, SEL1, SEL2, and SEL3 of the positive and negative components 1010+ and 1010− may be configured to have the same states, respectively.

Figure 11:
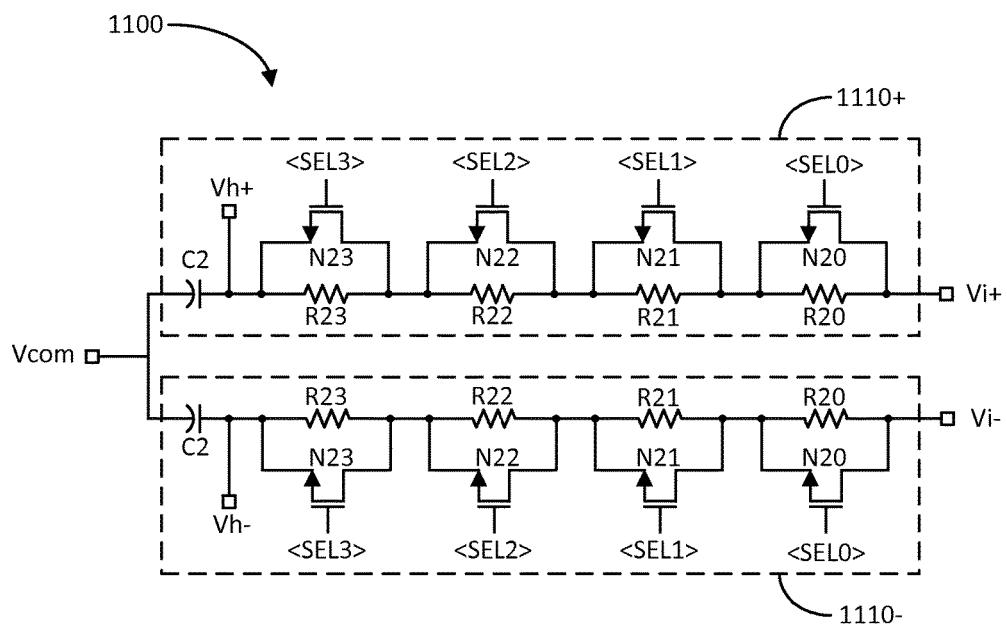
FIG. 11 illustrates a schematic diagram of an exemplary programmable low-pass filter (LPF) in accordance with another aspect of the disclosure.

FIG. 11 illustrates a schematic diagram of an exemplary programmable low-pass filter (HPF) 1100 in accordance with another aspect of the disclosure. The LPF 1100 may be an exemplary detailed implementation of any of the LPF described herein. The LPF 1100 includes a positive component 1110+ configured to low-pass filter a positive component Vi+ of an input differential data signal to generate a positive component Vh+ of a filtered differential signal. The LPF 1100 includes a negative component 1110− configured to low-pass filter a negative component Vi− of the input differential data signal to generate a negative component Vh− of the filtered signal. The positive and negative components Vh+ and Vh− of the filtered signal are applied to corresponding transistors of an input circuit of a sense amplifier, as previously discussed.

The positive component 1110+ of the LPF 1100 includes a set of selectable resistors R20, R21, R22, and R23 coupled in series with a capacitor C2 between a first port configured to receive the positive component Vi+ of the input differential signal and a second port configured to receive a common mode voltage Vcom. To make the set of resistors selectable, the positive LPF component 1110+ includes a corresponding set of switches N20, N21, N22, and N23 coupled in parallel with the resistors R20, R21, R22, and R23, respectively. In this example, the switches N20, N21, N22, and N23 are configured as NMOS devices, but may be configured as PMOS devices as well. A set of control signals SEL0, SEL1, SEL2, and SEL3 are applied to the gates of the switches N20, N21, N22, and N23 to control their respective on or off states. Thus, the frequency response of the positive component 1110+ of the LPF 1100 may be configured via the control signals SEL0, SEL1, SEL2, and SEL3.

The negative component 1110− of the LPF 1100 includes a set of selectable resistors R20, R21, R22, and R23 coupled in series with a capacitor C2 between a third port configured to receive the negative component Vi− of the input differential signal and the second port configured to receive the common mode voltage Vcom. To make the set of resistors selectable, the negative LPF component 1110− includes a corresponding set of switches N20, N21, N22, and N23 coupled in parallel with the resistors R20, R21, R22, and R23, respectively. In this examples, the switches N20, N21, N22, and N23 are configured as NMOS devices, but may be configured as PMOS devices as well. A set of control signals SEL0, SEL1, SEL2, and SEL3 are applied to the gates of the switches N20, N21, N22, and N23 to control their respective on or off states. Thus, the frequency response of the negative component 1110− of the LPF 1100 may be configured via the control signals SEL0, SEL1, SEL2, and SEL3.

The positive component Vh+ and negative components Vh− of the filtered signal are generated at the corresponding nodes between the corresponding resistor R23 and capacitor C2. Generally, the capacitors C2 of the positive and negative components 1110+ and 1110− are configured to have substantially the same capacitance. Similarly, the resistors R21, R22, R23, and R24 of the positive and negative components 1110+ and 1110− are configured to have substantially the same resistance, respectively. Also, the control signals SEL0, SEL1, SEL2, and SEL3 of the positive and negative components 1110+ and 1110− may be configured to have the same states, respectively.

Figure 12:
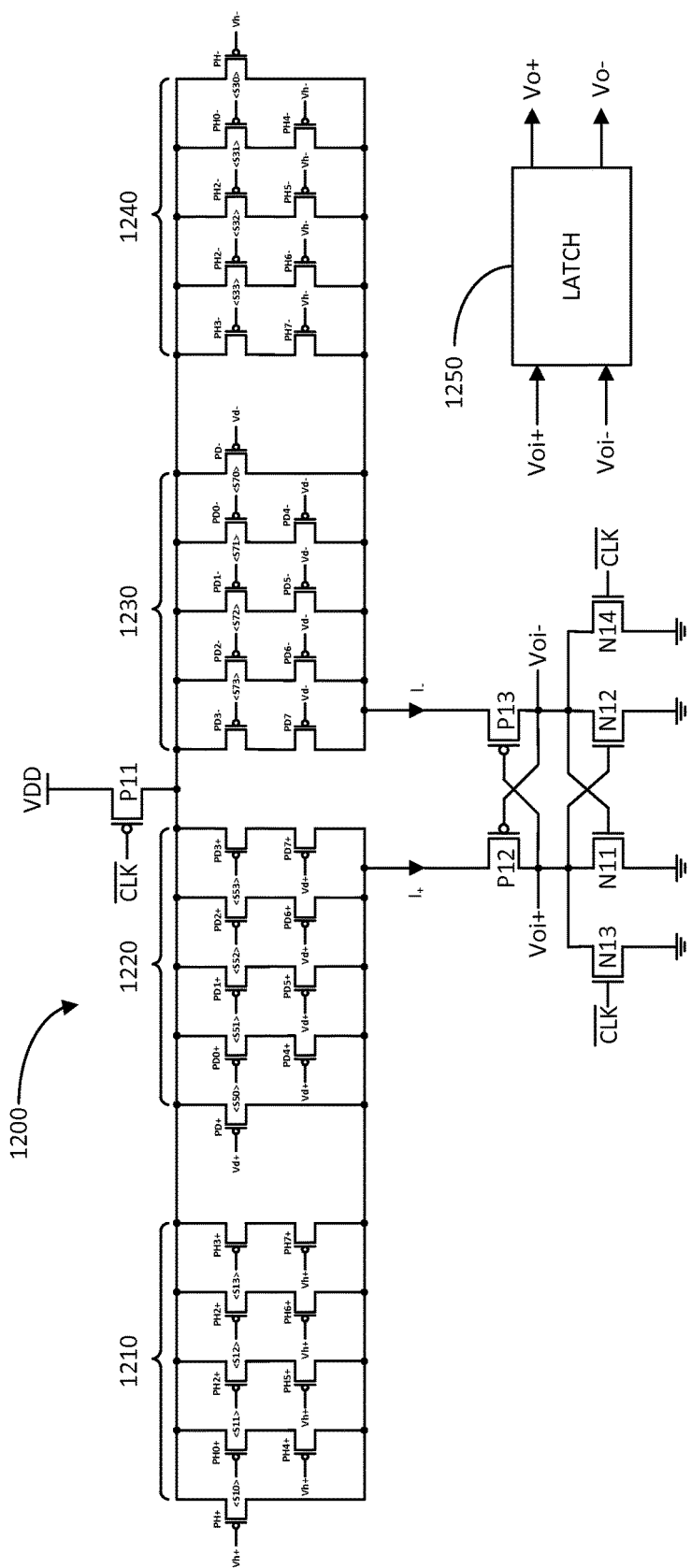
FIG. 12 illustrates a schematic diagram of an exemplary sense amplifier in accordance with another aspect of the disclosure.

FIG. 12 illustrates a schematic diagram of an exemplary sense amplifier 1200 in accordance with another aspect of the disclosure. In summary, the sense amplifier 1200 may be configured similar to the sense amplifier of receiving device 400 previously discussed, except that each of the input transistors includes a network of selectable transistors, which may be used to calibrate out current offset as discussed in more detail herein. Additionally, the sense amplifier 1200 further includes an additional latch to read out the differential voltage generated by the strong-arm latch of the sense amplifier.

In particular, the sense amplifier 1200 includes an input circuit having selectable transistor networks 1210, 1220, 1230, and 1240. Selectable transistor network 1210 includes PMOS PH+, PH0+ to PH3+, and PH4+ to PH7+. PMOS PH+ and PH0+ to PH3+ include sources coupled together. PMOS PH+ and PH4+ to PH7+ include drains coupled together. PH0+ to PH3+ include drains coupled to the sources of PH4+ to PH7+, respectively. PMOS PH+ and PH4+ to PH7+ include gates configured to receive a positive component Vh+ of a high-pass filtered signal of a passive equalizer, as previously discussed. The PH0+ to PH3+ include gates configured to receive control signals S10 to S13, respectively.

The sizes of PMOS PH4+ to PH7+ may be different, such as binary weighted. The size of PMOS PH+ may be larger than the sizes of PMOS PH4+ to PH7+, as PMOS PH+ may be configured as the device that provides the primary transconductance gain for the positive component Vh+ of the filtered signal. The PMOS PH4+ to PH7+ provide selectable refinement of the transconductance gain provided by the network 1210 based on the control signals S10-S13. The control signals S10-S13 selectively turn on the PMOS PH0+ to PH3+ to enable the corresponding PMOS PH4+ to PH7+ so that the total transconductance gain of the network 1210 may be set or controlled. As discussed in more detail herein, the control signals S10-S13 may be selected or adjusted to substantially calibrate out current offset associated with the sense amplifier 1200.

Similarly, the selectable transistor network 1240 includes PMOS PH−, PH0− to PH3−, and PH4− to PH7−. PMOS PH− and PH0− to PH3− include sources coupled together. PMOS PH− and PH4− to PH7− include drains coupled together. PH0− to PH3− include drains coupled to the sources of PH4− to PH7−, respectively. PMOS PH− and PH4− to PH7− include gates configured to receive a negative component Vh− of a high-pass filtered signal of a passive equalizer, as previously discussed. The PH0− to PH3− include gates configured to receive control signals S30 to S33, respectively.

The sizes of PMOS PH4− to PH7− may be different, such as binary weighted. The size of PMOS PH− may be larger than the sizes of PMOS PH4− to PH7−, as PMOS PH− may be configured as the device that provides the primary transconductance gain for the negative component Vh− of the filtered signal. The PMOS PH4− to PH7− provide selectable refinement of the transconductance gain provided by the network 1240 based on the control signals S30-S33. The control signals S30-S33 selectively turn on the PMOS PH0− to PH3− to enable the corresponding PMOS PH4− to PH7− so that the total transconductance gain of the network 1240 may be set or controlled. As discussed in more detail herein, the control signals S30-S33 may be selected or adjusted to substantially calibrate out current offset associated with the sense amplifier 1200.

Similarly, the selectable transistor network 1220 includes PMOS PD+, PD0+ to PD3+, and PD4+ to PD7+. PMOS PD+ and PD0+ to PD3+ include sources coupled together. PMOS PD+ and PD4+ to PD7+ include drains coupled together. PD0+ to PD3+ include drains coupled to the sources of PD4+ to PD7+, respectively. PMOS PD+ and PD4+ to PD7+ include gates configured to receive a positive component Vd+ of an all-pass path of a passive equalizer, as previously discussed. The PD0+ to PD3+ include gates configured to receive control signals S50 to S53, respectively.

The sizes of PMOS PD4+ to PD7+ may be different, such as binary weighted. The size of PMOS PD+ may be larger than the sizes of PMOS PD4+ to PD7+, as PMOS PD+ may be configured as the device that provides the primary transconductance gain for the positive component Vd+ of the all-pass path signal. The PMOS PD4+ to PD7+ provide selectable refinement of the transconductance gain provided by the network 1220 based on the control signals S50-S53. The control signals S50-S53 selectively turn on the PMOS PD0+ to PD3+ to enable the corresponding PMOS PD4+ to Pd7+ so that the total transconductance gain of the network 1220 may be set or controlled. As discussed in more detail herein, the control signals S50-S53 may be selected or adjusted to substantially calibrate out current offset associated with the sense amplifier 1200.

Similarly, the selectable transistor network 1230 includes PMOS PD−, PD0− to PD3−, and PD4− to PD7−. PMOS PD− and PD0− to PD3− include sources coupled together. PMOS PD− and PD4− to PD7− include drains coupled together. PD0− to PD3− include drains coupled to the sources of PD4− to PD7−, respectively. PMOS PD− and PD4− to PD7− include gates configured to receive a negative component Vd− of an all-pass path of a passive equalizer, as previously discussed. The PD0− to PD3− include gates configured to receive control signals S70 to S73, respectively.

The sizes of PMOS PD4− to PD7− may be different, such as binary weighted. The size of PMOS PD− may be larger than the sizes of PMOS PD4− to PD7−, as PMOS PD− may be configured as the device that provides the primary transconductance gain for the negative component Vd− of the all-pass path signal. The PMOS PD4− to PD7− provide selectable refinement of the transconductance gain provided by the network 1230 based on the control signals S70-S73. The control signals S70-S73 selectively turn on the PMOS PD0− to PD3− to enable the corresponding PMOS PD4− to PD7− so that the total transconductance gain of the network 1230 may be set or controlled. As discussed in more detail herein, the control signals S70-S73 may be selected or adjusted to substantially calibrate out current offset associated with the sense amplifier 1200.

The sense amplifier 1200 further includes a strong-arm latch having cross-coupled inverters P12-N11 and P13-N12. That is, the inverter P12-N11 has an output (at the drains of P12 and N11) coupled to an input of inverter P13-N12 (at the gates of P13 and N12), and the inverter P13-N12 has an output (at the drains of P13 and N12) coupled to an input of inverter P11-N13 (at the gates of P13 and N12). The source of PMOS P12 is coupled to the drains of PH+ and PH4+ to PH7+ of network 1210 and the drains of PD+ and PD4+ to PD7+ of network 1220. The source of PMOS P13 is coupled to the drains of PH− and PH4− to PH7− of network 1240 and the drains of PD− and PD4− to PD7− of network 1230. The sources of NMOS N11 and N12 are coupled to ground.

The sense amplifier 1200 further includes a circuitry for selectively enabling the operation of the sense amplifier for sampling the input differential signal. The enabling/disabling circuitry includes PMOS P11 and NMOS N13 and N14. The PMOS P11 includes a source coupled to a positive voltage rail VDD, a gate configured to receive a clock signal $\overline{CLK}$, and a drain coupled to the sources of PMOS PH+ and PH0+ to PH3+ of network 1210, PMOS PD+ and PD0+ to PD3+ of network 1220, PMOS PD− and PD0− to PD3− of network 1230, and PMOS PH− and PH0− to PH3− of network 1240. The NMOS N13 and N14 include drains coupled to the respective drains of latch NMOS N11 and N12, gates configured to receive the clock signal $\overline{CLK}$, and sources coupled to ground.

The operation of the sense amplifier 1200 is similar to that of sense amplifier of receiving device 400. The sense amplifier 1200 is configured to generate an intermediate output differential signal Voi+ and Voi− at the respective outputs of inverters P12-N11 and P13-N12. The sense amplifier 1200 further includes a latch 1250 to read out the intermediate output differential signal Voi+ and Voi− and generate an output differential signal Vo+ and Vo−.

Although the sense amplifier 1200 has been described as interfacing with an HPF-based passive equalizer, it shall be understood that the sense amplifier 1200 may be configured to interface with a LPF-based passive equalizer. In this regard, the negative component of the low-pass filtered signal is applied to the PMOS PH+ and PH4+ to PH7+, and the positive component of the low-pass filtered signal is applied to the PMOS PH− and PH4− to PH7−. The other portions of the sense amplifier 1200 would remain unchanged.

Figure 13:
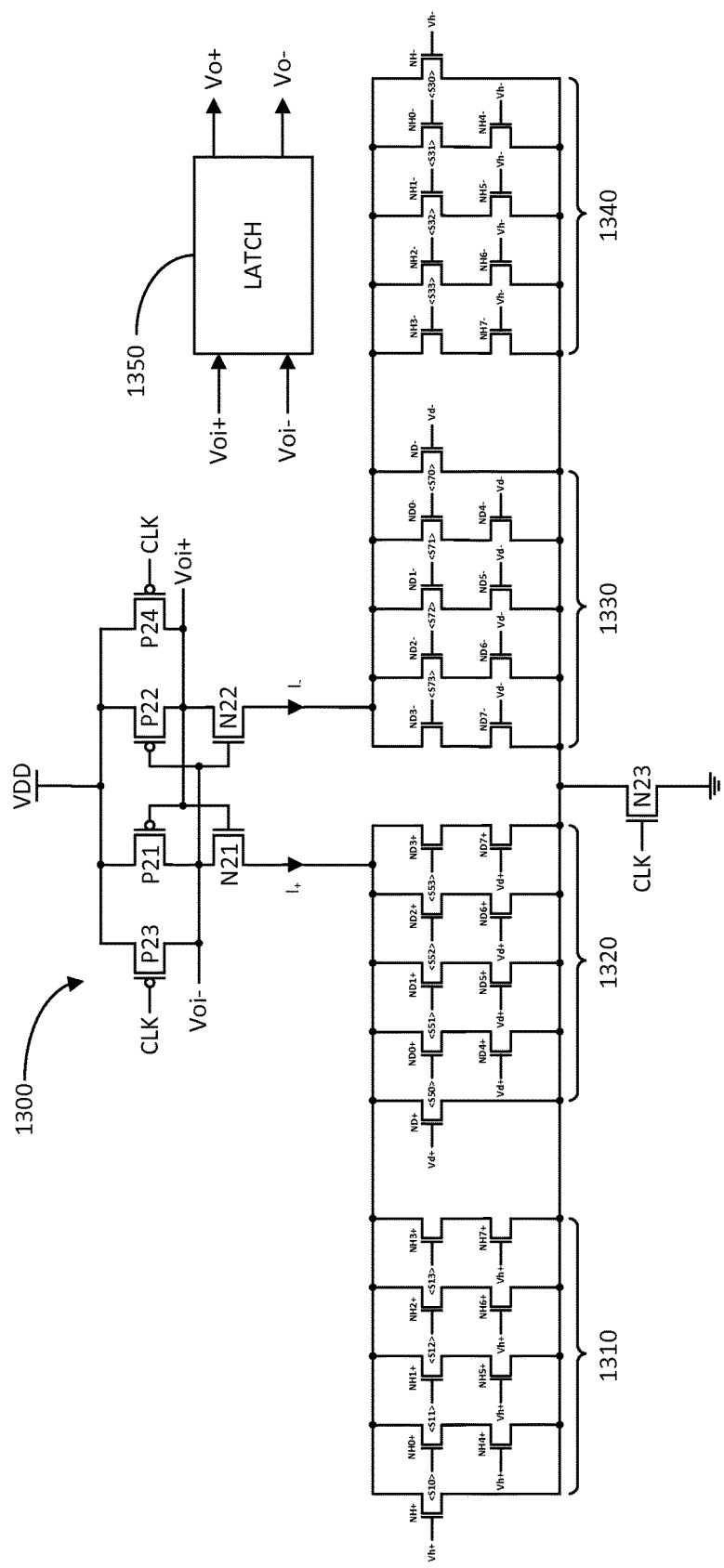
FIG. 13 illustrates a schematic diagram of another exemplary sense amplifier in accordance with another aspect of the disclosure.

FIG. 13 illustrates a schematic diagram of an exemplary sense amplifier 1300 in accordance with another aspect of the disclosure. In summary, the sense amplifier 1300 is an n-version of the sense amplifier 1200 previously discussed.

In particular, the sense amplifier 1300 includes an input circuit having selectable transistor networks 1310, 1320, 1330, and 1340. Selectable transistor network 1310 includes NMOS NH+, NH0+ to NH3+, and NH4+ to NH7+. NMOS NH+ and NH0+ to NH3+ include drains coupled together. NMOS NH+ and NH4+ to NH7+ include sources coupled together. NH0+ to NH3+ include sources coupled to the drains of NH4+ to NH7+, respectively. NMOS NH+ and NH4+ to NH7+ include gates configured to receive a positive component Vh+ of a high-pass filtered signal of a passive equalizer, as previously discussed. The NH0+ to NH3+ include gates configured to receive control signals S10 to S13, respectively.

The sizes of NMOS NH4+ to NH7+ may be different, such as binary weighted. The size of NMOS NH+ may be larger than the sizes of NMOS NH4+ to NH7+, as NMOS NH+ may be configured as the device that provides the primary transconductance gain for the positive component Vh+ of the filtered signal. The NMOS NH4+ to NH7+ provide selectable refinement of the transconductance gain provided by the network 1310 based on the control signals S10-S13. The control signals S10-S13 selectively turn on the NMOS NH0+ to NH3+ to enable the corresponding NMOS NH4+ to NH7+ so that the total transconductance gain of the network 1310 may be set or controlled. As discussed in more detail herein, the control signals S10-S13 may be selected or adjusted to substantially calibrate out current offset associated with the sense amplifier 1300.

Similarly, the selectable transistor network 1340 includes NMOS NH−, NH0− to NH3−, and NH4− to NH7−. NMOS NH− and NH0− to NH3− include drains coupled together. NMOS NH− and NH4− to NH7− include sources coupled together. NH0− to NH3− include sources coupled to drains of NH4− to NH7−, respectively. NMOS NH− and NH4− to NH7− include gates configured to receive a negative component Vh− of a high-pass filtered signal of a passive equalizer, as previously discussed. NMOS NH0− to NH3− include gates configured to receive control signals S30 to S33, respectively.

The sizes of NMOS NH4− to NH7− may be different, such as binary weighted. The size of NMOS NH− may be larger than the sizes of NMOS NH4− to NH7−, as NMOS NH− may be configured as the device that provides the primary transconductance gain for the negative component Vh− of the filtered signal. The NMOS NH4− to NH7− provide selectable refinement of the transconductance gain provided by the network 1340 based on the control signals S30-S33. The control signals S30-S33 selectively turn on the NMOS NH0− to NH3− to enable the corresponding NMOS NH4− to NH7− so that the total transconductance gain of the network 1340 may be set or controlled. As discussed in more detail herein, the control signals S30-S33 may be selected or adjusted to substantially calibrate out current offset associated with the sense amplifier 1300.

Similarly, the selectable transistor network 1320 includes NMOS ND+, ND0+ to ND3+, and ND4+ to ND7+. NMOS ND+ and ND0+ to ND3+ include drains coupled together. NMOS ND+ and ND4+ to ND7+ include sources coupled together. ND0+ to ND3+ include sources coupled to drains of ND4+ to ND7+, respectively. NMOS ND+ and ND4+ to ND7+ include gates configured to receive a positive component Vd+ of an all-pass path of a passive equalizer, as previously discussed. The ND0+ to ND3+ include gates configured to receive control signals S50 to S53, respectively.

The sizes of NMOS ND4+ to ND7+ may be different, such as binary weighted. The size of NMOS ND+ may be larger than the sizes of NMOS ND4+ to ND7+, as NMOS ND+ may be configured as the device that provides the primary transconductance gain for the positive component Vd+ of the all-pass path signal. NMOS ND4+ to ND7+ provide selectable refinement of the transconductance gain provided by the network 1320 based on the control signals S50-S53. The control signals S50-S53 selectively turn on the NMOS ND0+ to Nd3+ to enable the corresponding NMOS Nd4+ to ND7+ so that the total transconductance gain of the network 1320 may be set or controlled. As discussed in more detail herein, the control signals S50-S53 may be selected or adjusted to substantially calibrate out current offset associated with the sense amplifier 1300.

Similarly, the selectable transistor network 1330 includes NMOS ND−, ND0− to ND3−, and ND4− to ND7−. NMOS ND− and ND0− to ND3− include drains coupled together. NMOS ND− and ND4− to ND7− include sources coupled together. ND0− to ND3− include sources coupled to drains of ND4− to ND7−, respectively. NMOS ND− and ND4− to ND7− include gates configured to receive a negative component Vd− of an all-pass path of a passive equalizer, as previously discussed. The ND0− to ND3− include gates configured to receive control signals S70 to S73, respectively.

The sizes of NMOS ND4− to ND7− may be different, such as binary weighted. The size of NMOS ND− may be larger than the sizes of NMOS ND4− to ND7−, as NMOS ND− may be configured as the device that provides the primary transconductance gain for the negative component Vd− of the all-pass path signal. NMOS ND4− to ND7− provide selectable refinement of the transconductance gain provided by the network 1330 based on the control signals S70-S73. The control signals S70-S73 selectively turn on the NMOS ND0− to ND3− to enable the corresponding NMOS ND4− to ND7− so that the total transconductance gain of the network 1330 may be set or controlled. As discussed in more detail herein, the control signals S70-S73 may be selected or adjusted to substantially calibrate out current offset associated with the sense amplifier 1300.

The sense amplifier 1300 further includes a strong-arm latch having cross-coupled inverters P21-N21 and P22-N22. That is, the inverter P21-N21 has an output (at the drains of P21 and N21) coupled to an input of inverter P22-N22 (at the gates of P22 and N2), and the inverter P22-N22 has an output (at the drains of P22 and N22) coupled to an input of inverter P21-N21 (at the gates of P21 and N21). The sources of PMOS P21 and P22 are coupled to a positive voltage rail VDD. The source of NMOS N21 is coupled to the drains of NH+ and NH0+ to NH3+ of network 1310 and the drains of ND+ and ND0+ to ND3+ of network 1320. The source of NMOS N22 is coupled to the drains of NH− and NH0− to NH3− of network 1340 and the drains of ND− and ND0− to ND3− of network 1330.

The sense amplifier 1300 further includes a circuitry for selectively enabling the operation of the sense amplifier for sampling the input differential signal. The enabling/disabling circuitry includes PMOS P23 and P24, and NMOS N23. The PMOS P23 and P24 include sources coupled to VDD, gates configured to receive the clock signal CLK, and respective drains of latch PMOS P21 and P22. The NMOS N23 includes a drain coupled to the sources of NMOS NH+ and NH4+ to NH7+ of network 1310, NMOS ND+ and ND4+ to ND7+ of network 1320, NMOS ND− and ND4− to ND7− of network 1330, and NMOS NH− and NH4− to NH7− of network 1340.

The operation of the sense amplifier 1300 is similar to that of sense amplifier of receiving device 500. The sense amplifier 1300 is configured to generate an intermediate output differential signal Voi+ and Voi− at the respective outputs of inverters P22-N22 and P21-N21. The sense amplifier 1300 further includes a latch 1350 to read out the intermediate output differential signal Voi+ and Voi− and generate an output differential signal Vo+ and Vo−.

Although the sense amplifier 1300 has been described as interfacing with an HPF-based passive equalizer, it shall be understood that the sense amplifier 1300 may be configured to interface with a LPF-based passive equalizer. In this regard, the negative component of the low-pass filtered signal is applied to the NMOS NH+ and NH4+ to NH7+, and the positive component of the low-pass filtered signal is applied to the NMOS NH− and NH4− to NH7−. The other portions of the sense amplifier 1300 would remain unchanged.

Figure 14A:
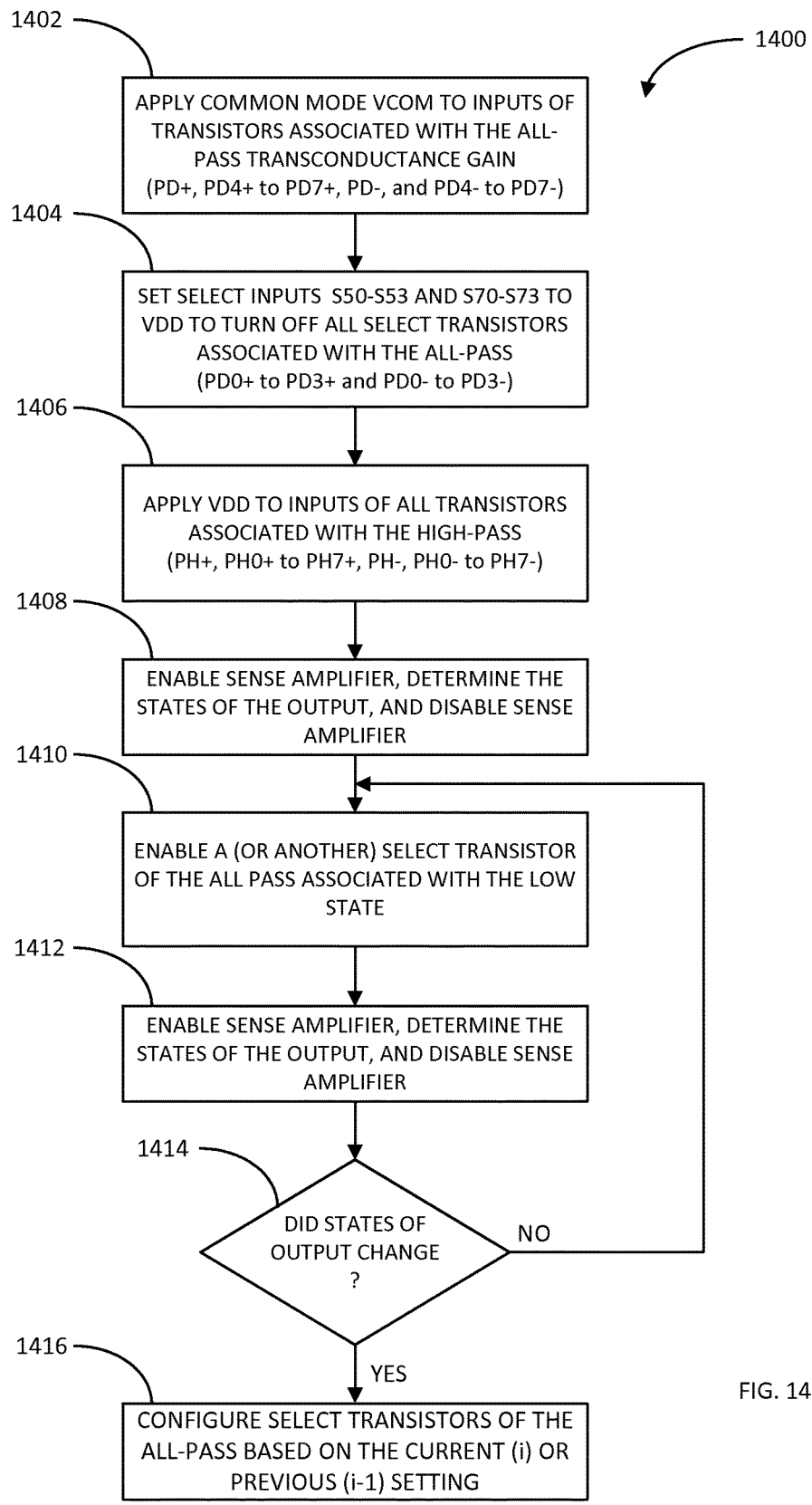
FIG. 14A illustrates a flow diagram of an exemplary method of substantially calibrating out current offset in a sense amplifier in accordance with another aspect of the disclosure.

FIG. 14A illustrates a flow diagram of an exemplary method 1400 of substantially calibrating out current offset in a sense amplifier in accordance with another aspect of the disclosure. The method 1400 is described with reference to sense amplifier 1200; although it is applicable to sense amplifier 1300.

A general concept of calibrating out current offset is that the summed currents associated with the positive signal side of the sense amplifier should be substantially the same as the summed currents associated with the negative signal side, when the positive and negative components Vi+ and Vi− of the input differential signal are both set to common mode voltage Vcom. However, due to imperfections in the sense amplifier, the summed currents associated with the positive signal side is not the same as the summed currents associated with the negative signal side. The method of substantially calibrating out the current offset described herein attempts to equalize the positive-side and negative-side currents in accordance with the resolution of the transconductance gain provided by the various input transistor networks.

In particular, the method 1400 includes applying common mode voltage Vcom to the inputs (gates) of the transistors associated with the all-pass transconductance gain (block 1402). With regard to sense amplifier 1200, these transistors include PMOS PD+, PMOS PD4+ to PD7+, PD−, and PD4− to PD7−. The method 1400 further includes setting the select signals S50-S53 and S70-S73 to VDD to turn off all the select transistors associated with the all-pass path (block 1404). With regard to sense amplifier 1200, these transistors include PMOS PD0+ to PD3+ and PD0− to PD3−.

The operations of blocks 1402 and 1404 are to initialize the input transistor networks 1220 and 1230 for substantially calibrating out the current offset associated with the all-pass path signal. That is, the same voltage Vcom is applied to both the positive and negative side of the input transistor networks 1220 and 1230. And, the transistors associated with the fine transimpedance gain adjustments are disabled by control signals S50-S53 and S70-S73 so that both input transistor networks 1220 and 1230 provide their respective minimal transconductance gain (e.g., the transconductance gains provided by PMOS PD+ and PMOS PD−, respectively).

The method 1400 further includes applying VDD to the inputs (gates) of all transistors associated with the high-pass filter (block 1406). With regard to sense amplifier 1200, these transistors include PMOS PH+, PMOS PH0+ to PH7+, PH−, and PH0− to PH7−. This operation is performed to disable the input transistor networks 1210 and 1240 associated with the high-pass filter, as the first phase of the current offset calibration is performed for the all-pass path.

The method 1400 further includes enabling the sense amplifier, determining the states of the output Vo+ and Vo−, and disabling the sense amplifier (block 1408). With regard to sense amplifier 1200, the sense amplifier 1200 is enabled by asserting the clock signal $\overline{CLK}$ (e.g., setting it to a low logic voltage (e.g., ground)). As previously discussed, the states of the output Vo+ and Vo− are based on which of the positive-side current $I_+$ or negative-side current $I_-$ is greater. If the positive-side current $I_+$ is greater than the negative-side current $I_-$, then the states of the output Vo+ and Vo− are high and low, respectively. Conversely, if the negative-side current $I_-$ is greater than the positive-side current $I_+$, then the states of the output Vo+ and Vo− are low and high, respectively. The sense amplifier 1200 is disabled by deasserting the clock signal $\overline{CLK}$ (e.g., setting it to a high logic voltage (e.g., VDD)).

The method 1400 further includes enabling a (or another) select transistor of the all-pass path associated with the output Vo+ or Vo− that settled to the low state pursuant to the operation of block 1408 (block 1410). For example, with regard to sense amplifier 1200, if the output Vo+ settled to the low state, then one of the select transistors PD0+ to PD3+ would be enabled by setting the corresponding one of the select signals S50-S53 to ground. Conversely, if the output Vo− settled to the low state, then one of the select transistors PD0− to PD3− would be enabled by setting the corresponding one of the select signals S70-S73 to ground.

In the case where the fine-adjustment transconductance transistors are configured as binary weighted transistors, and the operation specified in block 1410 is first performed (e.g., iteration i=1), then the select transistor associated with the least significant bit (LSB) one of the binary-weighted transistors is enabled so that the current generated by the corresponding network 1220 or 1230 is incremented by the minimum current resolution. For example, with regard to sense amplifier 1200, if the PMOS PD4+/PD4− to PD7+/PD7− are sized from smallest to largest, then either PMOS PD0+ or PD0− is enabled to add the transconductance gain of either PD4+ or PD4− to the network 1220 or 1230 based on which of the output Vo+ or Vo− settled to the low state in block 1408.

The method 1400 further includes enabling the sense amplifier, determining the states of the output Vo+ and Vo−, and disabling the sense amplifier (block 1412). Then, according to the method 1400, it is determined whether the output Vo+ and Vo− changed states (block 1414). If the output did not change states, then, according to the method 1400, the operations of blocks 1410, 1412, and 1414 are repeated again pursuant to an additional iteration (i=i+1). In this regard, the operation specified in block 1410 enables the select transistor associated with the binary number indicated by the current iteration i.

If the output changed in block 1414, then, according to the method 1400, the select transistors are set according to current setting i or the previous setting i−1 (block 1416). This means that the positive-side current $I_+$ associated with the all-pass path is equalized with the negative-side current $I_-$ associated with the all-pass path to within the minimum current resolution of the input transistor networks 1220 and 1230. The following provides a couple of examples of substantially calibrating out the current offset associated with the filtered signal.

Figures 1, 14B:
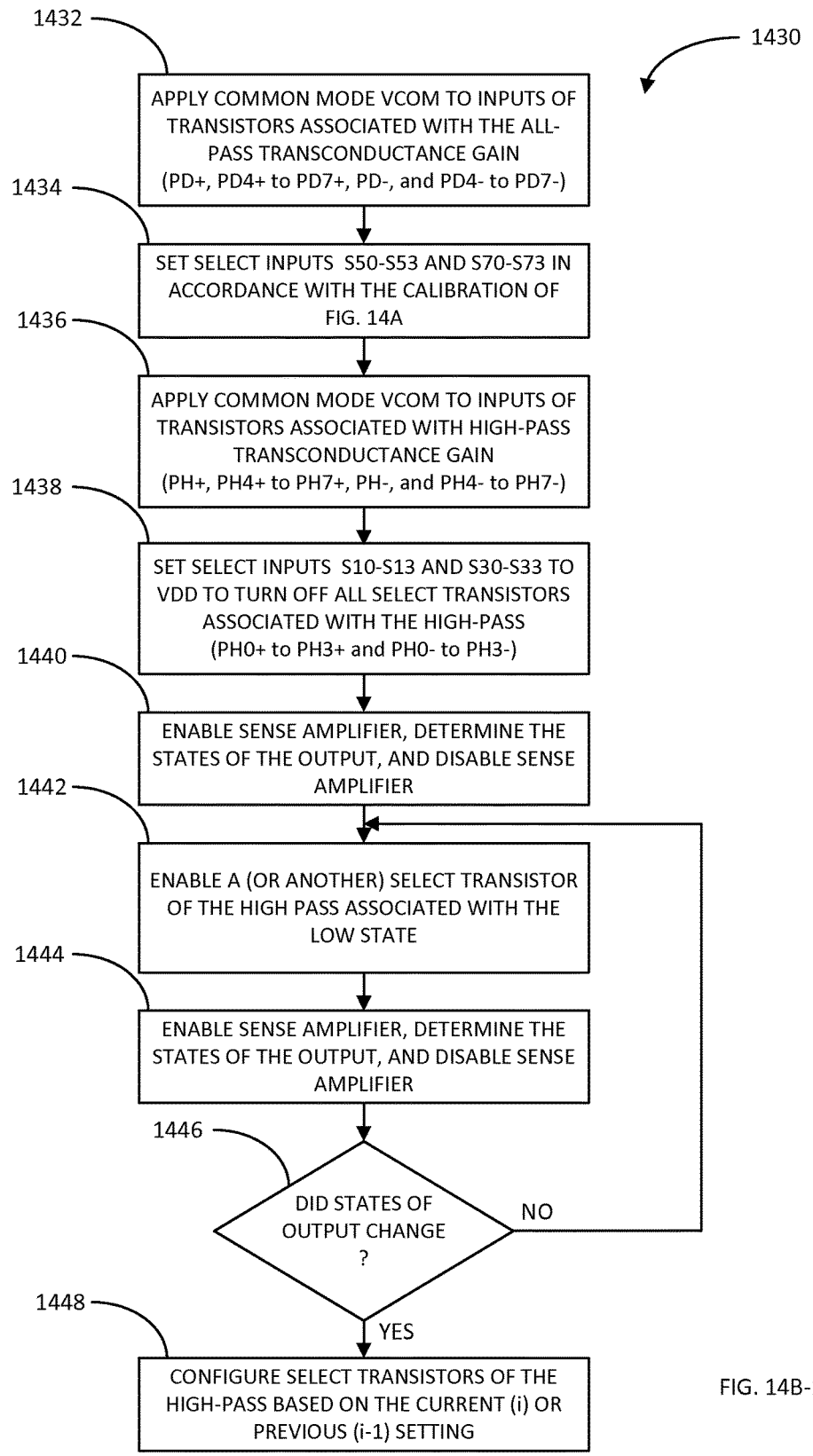
Figures 2, 14B:
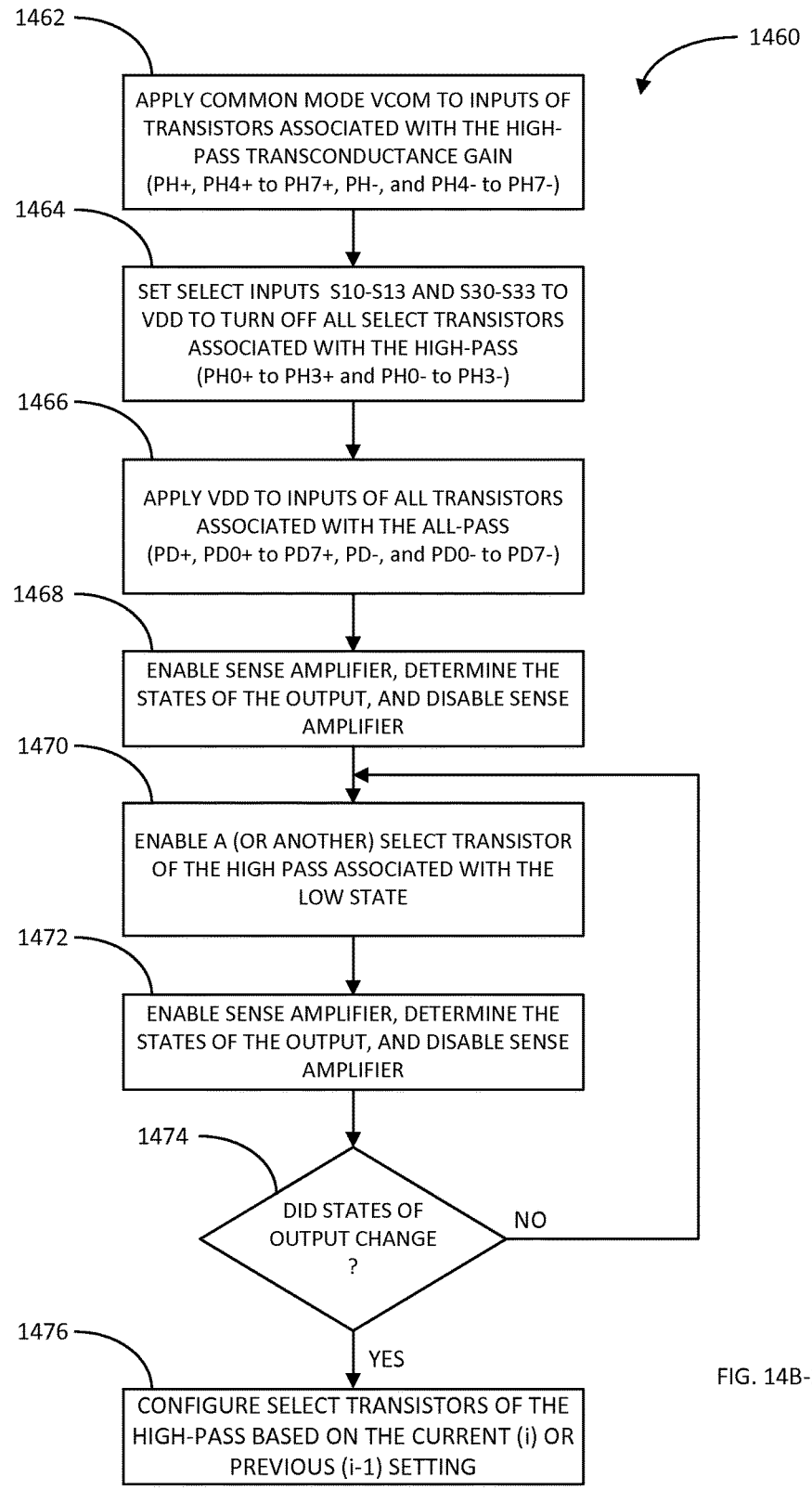

FIG. 14B-1 illustrates a flow diagram of another exemplary method 1430 of substantially calibrating out current offset in a sense amplifier in accordance with another aspect of the disclosure. The method 1430 is for calibrating out the current offset associated with the filtered signal. The method 1430 is performed while the common mode voltage is applied to the input transistor networks associated with the all-pass path, and the input transistor networks associated with the all-pass path are configured pursuant to the calibration performed in accordance with the method 1400.

In particular, the method 1430 includes applying common mode voltage Vcom to the inputs (gates) of the transistors associated with the all-pass transconductance gain (block 1432). As previously discussed with regard to sense amplifier 1200, these transistors include PMOS PD+, PMOS PD4+ to PD7+, PD−, and PD4− to PD7−. The method 1430 further includes setting the select signals S50-S53 and S70-S73 in accordance with the calibration performed pursuant to method 1400 (block 1434).

The method 1430 further includes applying common mode voltage to the inputs (gates) of the transconductance gain transistors associated with the high-pass filter (block 1436). With regard to sense amplifier 1200, these transistors include PMOS PH+, PH4+ to PH7+, PH−, and PH4− to PH7−. The method 1430 further includes setting the select signals S10-S13 and S30-S33 to VDD to turn off all the select transistors associated with the high-pass filter (block 1438). With regard to sense amplifier 1200, these transistors include PMOS PH0+ to PH3+ and PH0− to PH3−.

The method 1430 further includes enabling the sense amplifier, determining the states of the output Vo+ and Vo−, and disabling the sense amplifier (block 1440). The method 1430 further includes enabling a (or another) select transistor of the high-pass filter associated with the output Vo+ or Vo− that settled to the low state pursuant to the operation of block 1440 (block 1442). Similar to method 1400, if this is the first iteration i=1, the select transistor associated with the least significant bit (LSB) one of the binary-weighted transistors is enabled so that the current generated by the corresponding network 1210 or 1240 is incremented by the minimum current resolution.

The method 1430 further includes enabling the sense amplifier, determining the states of the output Vo+ and Vo−, and disabling the sense amplifier (block 1444). Then, according to the method 1430, it is determined whether the output Vo+ and Vo− changed states (block 1446). If the output did not change states, then, according to the method 1430, the operations of blocks 1442, 1444, and 1446 are repeated again pursuant to an additional iteration (i=i+1). In this regard, the operation specified in block 1442 enables the select transistor associated with the binary number indicated by the current iteration i.

If the output changed in block 1446, then, according to the method 1430, the select transistors are set according to current setting i or the previous setting i−1 (block 1448). This means that the positive-side current $I_+$ associated with the high pass filter is equalized with the negative-side current $I_-$ associated with the high pass filter to within the minimum current resolution of the input transistor networks 1210 or 1240.

FIG. 14B-2 illustrates a flow diagram of yet another exemplary method 1460 of substantially calibrating out current offset in a sense amplifier in accordance with another aspect of the disclosure. The method 1460 is an alternative to method 1430 for calibrating out the current offset associated with the filtered signal. In this case, the method 1460 is performed while the input transistor networks associated with the all-pass path are disabled.

In particular, the method 1460 includes applying common mode voltage Vcom to the inputs (gates) of the transistors associated with the high-pass filter (block 1462). As previously discussed with regard to sense amplifier 1200, these transistors include PMOS PH+, PMOS PH4+ to PH7+, PH−, and PH4− to PH7−. The method 1460 further includes setting the select signals S10-S13 and S30-S33 to VDD to turn off all the select transistors associated with the high-pass filter (block 1464). With regard to sense amplifier 1200, these transistors include PMOS PH0+ to PH3+ and PH0− and PH3−.

The method 1460 further includes applying VDD to the inputs (gates) of all the transistors associated with the all-pass path (block 1466). With regard to sense amplifier 1200, these transistors include PMOS PD+, PD0+ to PD7+, PD−, and PD0− to PD7−. This operation disables the input transistor networks 1220 and 1230 associated with the all-pass path.

The method 1460 further includes enabling the sense amplifier, determining the states of the output Vo+ and Vo−, and disabling the sense amplifier (block 1468). The method 1460 further includes enabling a (or another) select transistor of the high-pass filter associated with the output Vo+ or Vo− that settled to the low state pursuant to the operation of block 1468 (block 1470). Similar to method 1400, if this is the first iteration i=1, the select transistor associated with the least significant bit (LSB) one of the binary-weighted transistors is enabled so that the current generated by the corresponding network 1210 or 1240 is incremented by the minimum current resolution.

The method 1460 further includes enabling the sense amplifier, determining the states of the output Vo+ and Vo−, and disabling the sense amplifier (block 1472). Then, according to the method 1460, it is determined whether the output Vo+ and Vo− changed states (block 1474). If the output did not change states, then, according to the method 1460, the operations of blocks 1470, 1472, and 1474 are repeated again pursuant to an additional iteration (i=i+1). In this regard, the operation specified in block 1470 enables the select transistor associated with the binary number indicated by the current iteration i.

If the output changed in block 1474, then, according to the method 1460, the select transistors are set according to current setting i or the previous setting i−1 (block 1476). This ensures that the positive-side current $I_+$ associated with the high pass filter is equalized with the negative-side current $I_-$ associated with the high pass filter to within the minimum current resolution of the input transistor networks 1210 or 1240.

Figure 15:
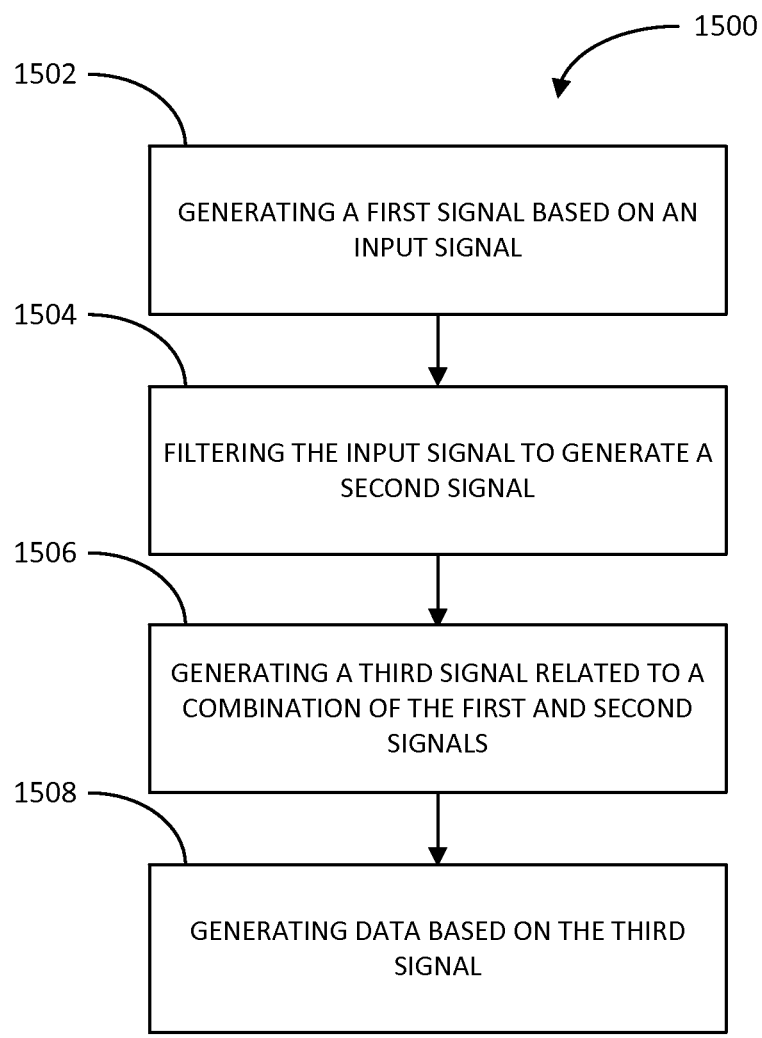
FIG. 15 illustrates a flow diagram of an exemplary method of detecting or generating data based on an input signal.

FIG. 15 illustrates a flow diagram of an exemplary method 1500 of detecting or generating data based on an input signal. The method 1500 includes generating a first signal based on an input signal (block 1502). The all-pass paths described herein are examples of means for generating a first signal based on an input signal. The method 1500 further includes filtering the input signal to generate a second signal (block 1504). The high-pass filter and low-pass filters described herein are examples of means for filtering the input signal to generate a second signal.

The method 1500 further includes generating a third signal related to a combination of the first and second signals (block 1506). The input circuits of the sense amplifiers described herein, which are configured to generate summed currents, are examples of means for generating a third signal related to a combination of the first and second signals. Additionally, the method 1500 includes generating data based on the third signal (block 1508). The strong-arm latches described herein are examples of generating data based on the third signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a passive equalizer comprising a first signal path configured to generate a first signal based on an input signal, and a second signal path configured to generate a second signal by filtering the input signal; and
   a sense amplifier comprising:
      a circuit configured to discharge or charge first and second nodes in response to a first state of a clock signal;
      an input circuit configured to generate a third signal related to a combination of the first and second signals in response to a second state of the clock signal; and
      a data detection circuit configured to generate data based on a first rate at which a first component of the third signal charges or discharges the discharged or charged first node compared to a second rate at which a second component of the third signal charges or discharges the discharged or charged second node; and
   wherein the first signal comprises a first differential signal including a first positive component and a first negative component, and the second signal comprises a second differential signal including a second positive component and a second negative component; and
   wherein the input circuit is further configured to:
      generate a first current based on the first positive component of the first differential signal;
      generate a second current based on the first negative component of the first differential signal;
      generate a third current based on the second positive component of the second differential signal; and
      generate a fourth current based on the second negative component of the second differential signal; and
         wherein the third signal comprises a fifth current related to a sum of the first and fourth currents, and a sixth current related to a sum of the second and third currents.

2. The apparatus of claim 1, wherein the second signal path comprises a high-pass filter.

3. The apparatus of claim 1, wherein the second signal path comprises a low-pass filter.

4. The apparatus of claim 1, wherein the first signal path comprises an all-pass path.

5. An apparatus, comprising:
   a passive equalizer comprising a first signal path configured to generate a first signal based on an input signal, and a second signal path configured to generate a second signal by filtering the input signal; and
   a sense amplifier comprising:
      a circuit configured to discharge or charge first and second nodes in response to a first state of a clock signal;
      an input circuit configured to generate a third signal related to a combination of the first and second signals in response to a second state of the clock signal; and
      a data detection circuit configured to generate data based on a first rate at which a first component of the third signal charges or discharges the discharged or charged first node compared to a second rate at which a second component of the third signal charges or discharges the discharged or charged second node; and
   wherein the first signal comprises a first differential signal including a first positive component and a first negative component, and the second signal comprises a second differential signal including a second positive component and a second negative component; and
   wherein the input circuit is further configured to:
      generate a first current based on the first positive component of the first differential signal; and
      generate a second current based on the first negative component of the first differential signal;
      generate a third current based on the second positive component of the second differential signal; and
      generate a fourth current based on the second negative component of the second differential signal;
      wherein the third signal comprises a fifth positive current related to a sum of the first and third currents, and a sixth negative current related to a sum of the second and fourth currents.

6. The apparatus of claim 5, wherein the data detection circuit is configured to generate the data based on whether the fifth current is greater than the sixth current.

7. A method, comprising:
   generating a first signal based on an input signal;
   filtering the input signal to generate a second signal;
   discharging or charging first and second nodes in response to a first state of a clock signal;
   generating a third signal related to a combination of the first and second signals in response to a second state of the clock signal; and
   generating data based on a first rate at which a first component of the third signal charges or discharges the discharged or charged first node compared to a second rate at which a second component of the third signal charges or discharges the discharged or charged second node; and
   wherein the first signal comprises a first differential signal including a first positive component and a first negative component, and the second signal comprises a second differential signal including a second positive component and a second negative component; and
   wherein generating the third signal further comprises:
      generating a first current based on the first positive component of the first differential signal; and generating a second current based on the first negative component of the first differential signal;
generating a third current based on the second positive component of the second differential signal; and
generating a fourth current based on the second negative component of the second differential signal;
wherein the third signal comprises a fifth current related to a sum of the first and fourth currents, and a sixth current related to a sum of the second and third currents.

8. The method of claim 7, wherein filtering the input signal comprises high-pass filtering the input signal.

9. The method of claim 7, wherein filtering the input signal comprises low-pass filtering the input signal.

10. The method of claim 7, wherein generating the first signal comprises passing the input signal through an all-pass path.

11. A method, comprising:
generating a first signal based on an input signal;
filtering the input signal to generate a second signal;
discharging or charging first and second nodes in response to a first state of a clock signal;
generating a third signal related to a combination of the first and second signals in response to a second state of the clock signal; and
generating data based on a first rate at which a first component of the third signal charges or discharges the discharged or charged first node compared to a second rate at which a second component of the third signal charges or discharges the discharged or charged second node; and
wherein the first signal comprises a first differential signal including a first positive component and a first negative component, and the second signal comprises a second differential signal including a second positive component and a second negative component; and
wherein generating the third signal further comprises:
generating a first current based on the first positive component of the first differential signal; and
generating a second current based on the first negative component of the first differential signal;
generating a third current based on the second positive component of the second differential signal; and
generating a fourth current based on the second negative component of the second differential signal;
wherein the third signal comprises a fifth current related to a sum of the first and fourth currents, and a sixth current related to a sum of the second and third currents.

12. The method of claim 11, wherein generating the data comprises generating the data based on whether the fifth current is greater than the sixth current.

13. An apparatus, comprising:
means for generating a first signal based on an input signal;
means for filtering the input signal to generate a second signal;
means for discharging or charging first and second nodes in response to a first state of a clock signal;
means for generating a third signal related to a combination of the first and second signals in response to a second state of the clock signal; and
means for generate data based on a first rate at which a first component of the third signal charges or discharges the discharged or charged first node compared to a second rate at which a second component of the third signal charges or discharges the discharged or charged second node,
wherein the first signal comprises a first differential signal including a first positive component and a first negative component, and the second signal comprises a second differential signal including a second positive component and a second negative component; and
wherein the means for generating the third signal further comprises:
means for generating a first current based on the first positive component of the first differential signal; and
means for generating a second current based on the first negative component of the first differential signal;
means for generating a third current based on the second positive component of the second differential signal; and
means for generating a fourth current based on the second negative component of the second differential signal;
wherein the third signal comprises a fifth current related to a sum of the first and fourth currents, and a sixth current related to a sum of the second and third currents.

14. The apparatus of claim 13, wherein the means for filtering the input signal comprises means for high-pass filtering the input signal.

15. The apparatus of claim 13, wherein the means for filtering the input signal comprises means for low-pass filtering the input signal.

16. The apparatus of claim 13, wherein the means for generating the first signal comprises means for passing the input signal through an all-pass path.

17. An apparatus, comprising:
means for generating a first signal based on an input signal;
means for filtering the input signal to generate a second signal;
means for discharging or charging first and second nodes in response to a first state of a clock signal;
means for generating a third signal related to a combination of the first and second signals in response to a second state of the clock signal; and
means for generate data based on a first rate at which a first component of the third signal charges or discharges the discharged or charged first node compared to a second rate at which a second component of the third signal charges or discharges the discharged or charged second node,
wherein the first signal comprises a first differential signal including a first positive component and a first negative component, and the second signal comprises a second differential signal including a second positive component and a second negative component; and
wherein the means for generating the third signal further comprises:
means for generating a first current based on the first positive component of the first differential signal; and
means for generating a second current based on the first negative component of the first differential signal;
means for generating a third current based on the second positive component of the second differential signal; and means for generating a fourth current based on the second negative component of the second differential signal;

wherein the third signal comprises a fifth positive current related to a sum of the first and third currents, and a sixth negative current related to a sum of the second and fourth currents.

18. The apparatus of claim 17, wherein the means generating the data comprises means for generating the data based on whether the fifth current is greater than the sixth current.

\* \* \* \* \*